(12) United States Patent
Endo et al.

(10) Patent No.: US 10,538,669 B2
(45) Date of Patent: Jan. 21, 2020

(54) COLOR MATERIAL DISPERSION LIQUID FOR COLOR FILTER, COLOR RESIN COMPOSITION FOR COLOR FILTER, COLOR MATERIAL FOR COLOR FILTER, COLOR FILTER, LIQUID CRYSTAL DISPLAY DEVICE, AND LIGHT-EMITTING DISPLAY DEVICE

(71) Applicant: Dai Nippon Printing Co., Ltd., Tokyo-to (JP)

(72) Inventors: Daisuke Endo, Tokyo-to (JP); Michihiro Ogura, Tokyo-to (JP); Tomoki Murata, Tokyo-to (JP); Fumiyasu Murakami, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 225 days.

(21) Appl. No.: 15/539,047

(22) PCT Filed: Oct. 15, 2015

(86) PCT No.: PCT/JP2015/079211
§ 371 (c)(1),
(2) Date: Jul. 20, 2017

(87) PCT Pub. No.: WO2016/103863
PCT Pub. Date: Jun. 30, 2016

(65) Prior Publication Data
US 2017/0349755 A1   Dec. 7, 2017

(30) Foreign Application Priority Data
Dec. 26, 2014   (JP) ................. 2014-266723

(51) Int. Cl.
*B32B 27/32* (2006.01)
*C09B 63/00* (2006.01)
(Continued)

(52) U.S. Cl.
CPC ............. *C09B 63/00* (2013.01); *G02B 5/20* (2013.01); *G02F 1/133514* (2013.01);
(Continued)

(58) Field of Classification Search
CPC ......... C09B 66/00; C09B 66/005; G02B 5/20; G02B 5/201; G02B 5/223; G02F 1/1335;
(Continued)

(56) References Cited

U.S. PATENT DOCUMENTS

| 2,626,255 A | 1/1953 | Blumenthal |
| 2014/0037866 A1 | 2/2014 | Okada |

(Continued)

FOREIGN PATENT DOCUMENTS

| CN | 101634725 | 1/2010 |
| CN | 104246548 | 12/2014 |

(Continued)

OTHER PUBLICATIONS

Handbook of Inorganic Salt Industry, 2nd Edition, Editor: Tianjin Institute of Chemical Industry, Publisher: Chemical Industry Press, p. 367, Jun. 1996—Concise Explanation included.

*Primary Examiner* — Ruiyun Zhang
(74) *Attorney, Agent, or Firm* — Hamre, Schumann, Mueller & Larson, P.C.

(57) ABSTRACT

Disclosed is a color material dispersion liquid for a color filter, the dispersion liquid having excellent dispersibility and being capable of forming a high-contrast, high-luminance coating film; a color resin composition for a color filter, the composition having excellent dispersibility and being capable of forming a high-contrast, high-luminance coating film; a color material with excellent dispersibility; a high-contrast and high-luminance color filter; a liquid crystal display device including the color filter, and a light-emitting display device including the color filter. The color material dispersion liquid for a color filter, includes: (A) a color material, (B) a dispersant and (C) a solvent, wherein the color material (A) contains a zirconium lake color material of an acid dye.

20 Claims, 2 Drawing Sheets

(51) Int. Cl.
  *G02B 5/20*   (2006.01)
  *G02F 1/1335*  (2006.01)
  *G03F 7/00*   (2006.01)
  *H01L 27/32*  (2006.01)

(52) U.S. Cl.
  CPC .......... *G03F 7/0007* (2013.01); *H01L 27/322* (2013.01); *Y10T 428/10* (2015.01); *Y10T 428/1036* (2015.01); *Y10T 428/1041* (2015.01)

(58) Field of Classification Search
  CPC ......... G02F 1/133514; G02F 1/133516; G02F 2202/04; G03F 7/0007; G03F 7/033; Y10T 428/10; Y10T 428/1036; Y10T 428/1041; H01L 27/322
  USPC ........... 428/1.1, 1.3, 1.31, 704; 349/69, 104, 349/107, 108; 252/586; 106/450; 534/602
  See application file for complete search history.

(56) References Cited

U.S. PATENT DOCUMENTS

| | | |
|---|---|---|
| 2015/0077685 A1 | 3/2015 | Okada et al. |
| 2015/0368473 A1 | 12/2015 | Okada et al. |
| 2016/0187547 A1 | 6/2016 | Murata et al. |
| 2016/0282530 A1 | 9/2016 | Ogura et al. |

FOREIGN PATENT DOCUMENTS

| | | |
|---|---|---|
| JP | 2001-081348 | 3/2001 |
| JP | 2010-026334 | 2/2010 |
| JP | 2010-237384 | 10/2010 |
| JP | 2012-194523 | 10/2012 |
| JP | 2014-152274 | 8/2014 |
| JP | 2014-224222 | 12/2014 |
| KR | 10-2010-0010490 | 2/2010 |
| TW | 201013233 | 4/2010 |
| TW | 201348342 | 12/2013 |
| TW | 201516100 | 5/2015 |
| WO | 2012/144521 | 10/2012 |

COLOR MATERIAL DISPERSION LIQUID FOR COLOR FILTER, COLOR RESIN COMPOSITION FOR COLOR FILTER, COLOR MATERIAL FOR COLOR FILTER, COLOR FILTER, LIQUID CRYSTAL DISPLAY DEVICE, AND LIGHT-EMITTING DISPLAY DEVICE

TECHNICAL FIELD

The present disclosure relates to a color material dispersion liquid for a color filter, a color resin composition for a color filter, a color material for a color filter, a color filter, a liquid crystal display device, and a light-emitting display device.

BACKGROUND ART

Many thin image display devices as typified by displays, i.e., flat panel displays, have been released on the market, because they are thinner than cathode-ray tube displays and they do not occupy much space in depth. Their market price has decreased year by year with advances in production techniques, resulting in a further increase in demand and a yearly increase in production. Especially, color LCD TVs have almost become the mainstream of TVs. Also in recent years, light-emitting display devices including organic light-emitting display devices such as organic EL displays, which provide high visibility by light emitted by themselves, have received attention as the next generation of image display devices. In relation to the performance of these image display devices, there is a strong demand for a further increase in image quality, such as an increase in contrast and color reproducibility, and a decrease in power consumption.

A color filter is used in these liquid crystal display devices and light-emitting display devices. For example, in the case of color LCDs, the amount of light is controlled by using a back light as the light source and electrically driving the liquid crystal. The light passes through the color filter and represents colors. Accordingly, the color filter is indispensable for color representation in LCD TVs and plays a large role in determining display performance. In organic light-emitting display devices, a color image is formed in the same manner as liquid crystal display devices, when the color filter is used in combination with an organic, white light-emitting element.

A recent trend is that there is a demand for power-saving image display devices. To increase backlight use efficiency, there is a very high demand for high-luminance color filters. This is a major issue especially for mobile displays such as mobile phones, smart phones and tablet PCs.

Even though technological advances have increased battery capacity, there is still a limit on battery capacity of mobile devices. Meanwhile, there is a trend that power consumption has grown with the increase in screen size. Image display devices including a color filter determine the design and performance of mobile terminal devices, because they are directly linked to the usable time and charging frequency of mobile terminal devices.

In general, a color filter has a transparent substrate, color layers made of color patterns of the three primary colors (red, green and blue), and a light shielding part formed on the transparent substrate so as to define each color pattern.

To form such color layers, a pigment dispersion method in which pigments with excellent heat resistance and light resistance are used as color materials, has been widely used.

However, it is difficult for color filters produced by use of pigments to satisfy the latest demand for higher luminance.

As a means to achieve higher luminance, dye-containing color resin compositions for a color filter have been studied. In general, dyes have a higher transmittance and can produce a higher-luminance color filter than pigments. However, dyes have a problem in that they are inferior in heat resistance and light resistance to pigments and the chromaticity is likely to change when they are heated at high temperature in a color filter production process, for example. Also, color resin compositions containing dyes have a problem in that cured coating films of the resin compositions have poor solvent resistance, and the dyes transfer to adjacent pixels in other colors or to cured films that do not contain colorants (e.g., protective films). In addition, color resin compositions produced by use of dissolved dyes have many problems when they are used for color filter applications. For example, aggregates are likely to precipitate on the surface of a cured coating film during a drying process, and a remarkable decrease in contrast is caused by the fluorescence of the dyes.

As a method for improving various kinds of resistance properties of dyes, a method for producing a salt-forming dye is known.

In Patent Document 1, a color photosensitive composition containing a dyed lake pigment is disclosed as a color photosensitive composition with excellent heat resistance, light resistance, color characteristics and transparency. Also, as the examples of the dyed lake pigment, publicly-known pigments with color index numbers are described.

In Patent Document 2, a blue color composition for a color filter, the composition containing a colorant consisting of a copper phthalocyanine blue pigment and a metal lake pigment of a xanthene-based dye, is disclosed as a blue color composition for a color filter, the composition being capable of forming a color filter having high luminosity and a wide color reproduction range. In Patent Document 3, a blue color composition for a color filter, the composition containing a blue pigment and a salt-forming compound obtained by reaction of a xanthene-based acid dye and a quaternary ammonium salt, is disclosed as the composition for organic EL display devices, the composition being capable of forming a color filter having high luminosity and a wide color reproduction range. However, the salt-forming compound still has a problem in that a cured coating film of the composition has poor solvent resistance, and a decrease in contrast is caused by fluorescence.

In Patent Document 4, a color filter and so on are disclosed by the applicant of the present application, which use specific color materials containing divalent or higher anions and divalent or higher cations, in which dye skeletons are crosslinked by crosslinking groups. It is disclosed that the color materials are excellent in heat resistance since, due to containing the divalent or higher anions and the divalent or higher cations, molecular associations are formed therein, and color filters using the color materials have high contrast and are excellent in solvent resistance and electric reliability.

Patent Document 5 discloses a zirconium lake pigment. In Patent Document 5, triarylmethane-based, xanthene-based, azo-based and quinoline-based dyes are provided as examples of the dye skeleton of the lake pigment. In Patent Document 5, only fluorescein-based dyes are provided as examples of the xanthene-based dyes, and there is no description of rhodamine-based acid dyes.

CITATION LIST

Patent Document 1: Japanese Patent Application Laid-Open (JP-A) No. 2001-81348

Patent Document 2: JP-A No. 2010-26334
Patent Document 3: JP-A No. 2012-194523
Patent Document 4: International Publication No. WO2012/144521
Patent Document 5: U.S. Pat. No. 2,626,255

SUMMARY

Technical Problem

To control a color filter to a desired color tone in conformity with a wide variety of back lights, using a combination of two or more kinds of color materials is needed. For example, in the case of obtaining a blue color layer, a desired color tone is generally obtained by use of a blue color material in combination with a red-tinged violet or red color material. In the case of using a conventionally-used pigment as a color material, due to low transmittance of the pigment, there is a problem of a decrease in luminance. In the case of using a dye, due to low heat resistance of the dye, there is a problem of a decrease in luminance after the dye is subjected to a post baking step in color filter production.

Therefore, in Patent Document 2, adding a metal lake pigment (e.g., PR81) of a xanthene-based basic dye (Rhodamine 6G) to a blue pigment composed of copper phthalocyanine blue, is proposed.

However, it was found that in the case of using the metal lake pigment of the xanthene-based basic dye, there is such a problem that the xanthene dye sublimes during a post baking step in color filter production. Once a color material sublimes from a color layer of a color filter, there is such a problem that not only the color tone of the color layer changes, but also the sublimed color material attaches to different color layers and so on and changes the color tone of the different color layers, resulting in a decrease in luminance and occurrence of contamination inside a heating device. Even in the case of using the salt-forming compound disclosed in Patent Document 3, which is a compound obtained by reaction of a xanthene-based acid dye and a quaternary ammonium salt, there is such a problem that a sublimate is produced in the post baking step.

In the case of using the aluminum chloride described in Patent Literature 2, which is a metal lake color material of an acid dye, as a laking agent, there is a problem of poor dispersibility and poor color filter contrast.

The present invention was achieved in light of the above circumstances. An object of the present invention is to provide the following: a color material dispersion liquid for a color filter, the dispersion liquid having excellent dispersibility and being capable of forming a high-contrast, high-luminance coating film; a color resin composition for a color filter, the composition being capable of forming a high-contrast, high-luminance coating film; a color material for a color filter, the color material having excellent dispersibility and being inhibited from subliming when heated at high temperature; a high-contrast, high-luminance color filter; a liquid crystal display device comprising the color filter; and a light-emitting display device comprising the color filter.

Solution to Problem

According to an embodiment of the present invention there is provided a color material dispersion liquid for a color filter, comprising: (A) a color material, (B) a dispersant and (C) a solvent, wherein the color material (A) contains a zirconium lake color material of an acid dye.

According to an embodiment of the present invention there is provided a color resin composition for a color filter, comprising the above-mentioned color material dispersion liquid for a color filter and (D) a binder component.

According to an embodiment of the present invention there is provided a color material for a color filter comprising a zirconium lake color material of a rhodamine-based acid dye.

The color material for a color filter according to the embodiment of the present invention is a color material having excellent dispersibility, having excellent heat resistance, and being inhibited from subliming when heated at high temperature.

According to an embodiment of the present invention there is provided a color filter comprising at least a transparent substrate and color layers disposed on the substrate, wherein at least one of the color layers contains a zirconium lake color material of an acid dye.

According to an embodiment of the present invention there is provided a liquid crystal display device comprising the above-described color filter, a counter substrate, and a liquid crystal layer disposed between the color filter and the counter substrate.

According to an embodiment of the present invention there is provided a light-emitting display device comprising the above-described color filter and a light-emitting body.

DESCRIPTION OF EMBODIMENTS

Figure 1:
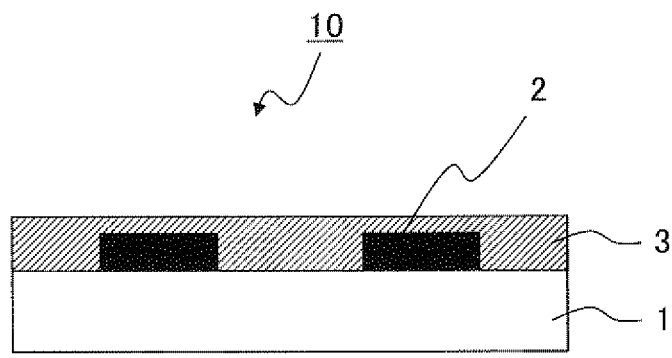
FIG. 1 is a schematic sectional view of an example of the color filter according to an embodiment of the present invention.

Hereinafter, a color material dispersion liquid for a color filter, a color resin composition for a color filter, a color material for a color filter, a color filter, a liquid crystal display device, and a light-emitting display device, which are all according to some embodiments of the present invention, will be described in order.

In the present disclosure, "light" encompasses electromagnetic waves in visible and non-visible wavelength ranges and radial rays. Radial rays include microwaves and electron beams, more specifically, electromagnetic waves having a wavelength of 5 μm or less and electron beams.

Also in the present disclosure, "(meth)acrylic" means any of acrylic and methacrylic, and "(meth)acrylate" means any of acrylate and methacrylate.

Also in the present disclosure, "organic group" means a group having one or more carbon atoms.

1. Color Material Dispersion Liquid for a Color Filter

The color material dispersion liquid for a color filter according to an embodiment of the present invention comprises: (A) a color material, (B) a dispersant and (C) a solvent, wherein the color material (A) contains a zirconium lake color material of an acid dye.

In an embodiment of the present invention, an acid dye is laked with a zirconium compound for use. Therefore, in either a solvent or coating film, the lake color material is dispersed in the form of fine particles.

In the color material dispersion liquid for a color filter according to an embodiment of the present invention, the color material (A) contains the zirconium lake color material of the acid dye, and the color material (A) is dispersed in the solvent (C). Therefore, the color material dispersion liquid is capable of having excellent dispersibility of the color material and forming a high-contrast, high-luminance coating film with a desired controlled color tone.

The mechanism how the above-described effect is exerted by the above-specified combination, is not clear yet; however, it is presumed as follows.

Zirconium compounds in aqueous solutions are known to have a wide variety of structures. This is because zirconium (IV) ions have such properties that they are highly charged ions relatively large in size and easily accept a ligand. In many cases, it is thought that zirconium exists in the form of a polymer and not in the form of a $Zr^{4+}$ monomer (for example, see BUNSEKI KAGAKU VOL. 59, No. 6, pp 447-454). In an embodiment of the present invention, since a zirconium compound with such properties is used as a laking agent, it is thought that at the time of laking, the zirconium compound is polymerized in a solution and easily forms a basic polynuclear condensed ion. Therefore, the laking agent is easily provided with a high (tetravalent or higher) positive charge and has a larger molecular size than the case of using a general metal cation (e.g., $Al^{3+}$, $Ca^{2+}$, $Mg^{2+}$) as a laking agent. Therefore, it is presumed that particles deposit before they are fully grown, so that small primary particles are produced. The acid dye laked in this manner takes on a largely decreased solubility in solvents and, therefore, properties closer to those of pigments. Accordingly, using the zirconium compound as the laking agent has such advantages that a color material with excellent dispersibility and heat resistance can be obtained, and the laked color material can be easily collected (by filtration) in color material production.

In addition, it is presumed that since the cation of the zirconium compound does not disturb the permeability of the acid dye, the zirconium lake color material of the acid dye obtains similar permeability as the acid dye and high luminance.

Meanwhile, the inventors of the present invention found that in the case of using a xanthene-based dye in a color layer of a color filter, even if the xanthene-based dye is laked, the xanthene-based dye can sublime during a high-temperature heating step in color filter production. In light of this finding, the inventors of the present invention made more research and found the following: among xanthene-based dyes, a metal lake color material of a fluorescein-based dye or rhodamine-based basic dye is likely to sublime, and a salt-forming compound produced from a combination a rhodamine-based acid dye and a quaternary ammonium salt compound also produces a sublimate; however, in the case of using the zirconium lake color material of the rhodamine-based acid dye according to an embodiment of the present invention, due to an increase in heat resistance, the color material is inhibited from subliming when heated at high temperature.

The color material dispersion liquid for a color filter according to an embodiment of the present invention contains at least the color material (A), the dispersant (B) and the solvent (C). It can further contain other components, to an extent that does not impair the effect of the present invention. Hereinafter, the components of the color material dispersion liquid for a color filter according to an embodiment of the present invention, will be described in detail.

[(A) Color Material]

The color material (A) used in the color material dispersion liquid according to an embodiment of the present invention contains at least a zirconium lake color material of an acid dye.

<Zirconium Lake Color Material of Acid Dye>

In an embodiment of the present invention, the acid dye is a dye that has at least one of acidic groups (e.g., a sulfo group and a carboxy group) and salts thereof per molecule and that is anionic as the whole molecule. In the zirconium lake color material of the acid dye, the lake color material is formed by the anion of the acid dye and the cation of the zirconium compound used as the laking agent.

In either a solvent or coating film, the zirconium lake color material of such an acid dye is dispersed in the form of fine particles. The dye in the fine particles aggregates at the molecular level, while forming a salt with the cation in the laking agent. In an embodiment of the present invention, aggregation between the lake color materials is easily inhibited, and the lake color material is provided with excellent dispersibility; therefore, it is thought that the contrast of a coating film is increased.

In addition, since the zirconium lake color material of such an acid dye contains zirconium and is dispersed in the form of fine particles, the color material provides excellent chemical resistance when it is in the form of a coating film.

(Acid Dye)

The acid dye is not particularly limited. As the acid dye, examples include, but are not limited to, xanthene-based acid dyes including rhodamine-based acid dyes and fluorescein-based acid dyes, phthalocyanine-based acid dyes, triarylmethane-based acid dyes, azo-based acid dyes, anthraquinone-based acid dyes and indigo-based acid dyes.

Conventional metal lake color materials of fluorescein-based dyes and rhodamine-based basic dyes easily sublimate. However, the zirconium lake color material of the rhodamine-based acid dye according to an embodiment of the present invention has excellent dispersibility of the color material, and since it has better heat resistance, the color material is inhibited from subliming when heated at high temperature. Therefore, the zirconium lake color material of the rhodamine-based acid dye is favorably used as the color material according to an embodiment of the present invention.

The rhodamine-based acid dye is a derivative of 6-aminoxanthene-3-imine, and it is such an anionic dye that it has a structure in which at least two hydrogen atoms per molecule are substituted with substituent groups having at least one of acidic groups (e.g., a sulfo group and a carboxy group) and salts thereof.

Such a rhodamine-based acid dye contains a cationic imine moiety and is anionic as the whole molecule. Therefore, the rhodamine-based acid dye usually contains two or more substituent groups having at least one of the acidic groups and salts thereof per molecule and has at least a pair of intramolecular salts (betaine structure). Because of this, it is presumed that such a rhodamine-based acid dye is stabilized to provide excellent heat resistance. Also, since the rhodamine-based acid dye has at least one anionic acidic group, in addition to the intramolecular salt structure per molecule, it is presumed that when the rhodamine-based acid dye is laked with a cationic zirconium compound and formed into fine particles, a strong electrical or acid-base interaction occurs both inside and between the molecules of the rhodamine-based acid dye, thus obtaining excellent heat resistance and inhibiting sublimation.

The rhodamine-based acid dye preferably has a phenyl group at the 9-position of the xanthene skeleton. The structure represented by the following general formula (II) is preferably used as the rhodamine-based acid dye:

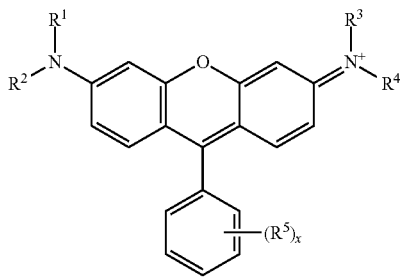

wherein each of $R^1$, $R^2$, $R^3$ and $R^4$ is independently a hydrogen atom, an alkyl group, an aryl group or a heteroaryl group; $R^1$ and $R^2$ can be bound to form a ring structure, and/or $R^3$ and $R^4$ can be bound to form ring structure; $R^2$ and a carbon atom at the 5-position of the xanthene ring, $R^2$ and a carbon atom at the 7-position of the xanthene ring, $R^3$ and a carbon atom at the 4-position of the xanthene ring, or $R^4$ and a carbon atom at the 2-position of the xanthene ring can be bound to form a ring structure; the hydrogen atom in the aryl or heteroaryl group can be substituted with an acidic group or a salt thereof, or with a halogen atom; $R^5$ is an acidic group or a salt thereof; "x" is an integer of 0 to 5; and the general formula (II) has at least two acidic groups or salts thereof, and one of the at least two acidic groups or salts thereof forms an intramolecular salt.

The alkyl group as $R^1$ to $R^4$ is preferably a straight- or branched-chain alkyl group which has 1 to 20 carbon atoms and which can have a substituent group, more preferably a straight- or branched-chain alkyl group which has 1 to 8 carbon atoms and which can have a substituent group, and still more preferably a straight- or branched-chain alkyl group which has 1 to 5 carbon atoms and which can have a substituent group. The substituent group that the alkyl group can have is not particularly limited. As the substituent group, examples include, but are not limited to, an aryl group and a halogen atom. The aryl group can further have a halogen atom or an acidic group or a salt thereof as a substituent group.

The aryl group as $R^1$ to $R^4$ is preferably an aryl group which has 6 to 20 carbon atoms and which can have a substituent group, and more preferably a group which has a phenyl group, a naphthyl group, etc.

The heteroaryl group as $R^1$ to $R^4$ is preferably a heteroaryl group which has 5 to 20 carbon atoms and which can have a substituent group, and it is preferably one having a nitrogen atom, an oxygen atom and/or a sulfur atom as a heteroatom.

As the substituent group that the aryl or heteroaryl group can have, examples include, but are not limited to, an alkyl group having 1 to 5 carbon atoms, a halogen atom, an acidic group or a salt thereof, a hydroxyl group, an alkoxy group, a nitrile group, a carbamoyl group and a carboxylic acid ester group.

"$R^1$ and $R^2$ are bound to form a ring structure, and/or $R^3$ and $R^4$ are bound to form a cyclic structure" means that $R^1$ and $R^2$ form a ring structure through a nitrogen atom, and/or $R^3$ and $R^4$ form a ring structure through a nitrogen atom. The ring structure is not particularly limited. As the ring structure, examples include, but are not limited to, 5- to 7-membered, nitrogen-containing heterocyclic rings. As the hetero-cyclic rings, examples include, but are not limited to, a pyrrolidine ring, a piperidine ring and a morpholine ring.

"$R^1$ and a carbon atom at the 5-position of the xanthene ring, $R^2$ and a carbon atom at the 7-position of the xanthene ring, $R^3$ and a carbon atom at the 4-position of the xanthene ring, or $R^4$ and a carbon atom at the 2-position of the xanthene ring are bound to form a ring structure" means that a combination of any one of $R^1$ to $R^4$ and a carbon atom at a given position of the xanthene ring each form a ring structure through a nitrogen atom and a part of the xanthene skeleton. The ring structure is not particularly limited. As the ring structure, examples include, but are not limited to, 5- to 7-membered, nitrogen-containing heterocyclic rings.

For the rhodamine-based acid dye represented by the general formula (II), from the viewpoint of increasing light resistance and heat resistance, it is particularly preferable that each of $R^1$ and $R^3$ is independently a hydrogen atom, an alkyl group, an aryl group or a heteroaryl group, and each of $R^2$ and $R^4$ is independently an aryl group or a heteroaryl group. The reason is presumed as follows: when each of $R^2$ and $R^4$ is independently an aryl group or a heteroaryl group, lone electron pairs of the nitrogen atoms to which $R^2$ and $R^4$ are bound, resonate with not only the xanthene skeleton but also the aryl or heteroaryl groups, thereby stabilizing each molecule.

As the acidic group or salt thereof, examples include, but are not limited to, a carboxy group (—COOH), a carboxylato group (—COO$^-$), a carboxylic acid salt group (—COOM where "M" is a metal atom), a sulfonato group (—SO$_3^-$), a sulfo group (—SO$_3$H) and a sulfonic acid salt group (—SO$_3$M where "M" is a metal atom). It is preferable to have at least one of a sulfonato group (—SO$_3^-$), a sulfo group (—SO$_3$H) and a sulfonic acid salt group (—SO$_3$M). As the metal atom M, examples include, but are not limited to, a sodium atom and a potassium atom.

The general formula (II) has at least two acidic groups or salts thereof, and one of them forms an intramolecular salt. In the general formula (II), "x" is preferably a positive number of 1 or 2, and more preferably 1. When "x" is 1, it is preferable that at least one of $R^2$ and $R^4$ has an acidic group, and it is more preferable that at least one of $R^2$ and $R^4$ is an aryl group having an acidic group. This is because a reaction between the acidic group and the cation species is efficiently promoted when the acidic group is distantly positioned in each molecule.

As the rhodamine-based acid dye, examples include, but are not limited to, C.I. Acid Red 50, 52, 289 and 388, C.I. Acid Violet 9 and 30, and C.I. Acid Blue 19.

As acid dyes other than the rhodamine-based acid dye, examples include, but are not limited to, the following:

xanthene-based acid dyes including fluorescein-based acid dyes such as C.I. Acid Red 51, 87, 91, 92, 93, 94 and 98, C.I. Acid Orange 11, and C.I. Acid Yellow 73 and 74;

anthraquinone-based acid dyes such as C.I. Acid Violet 34, 36, 39, 41, 42, 43, 47, 51, 63 and 126, C.I. Acid Blue 25, 27, 35, 40, 41, 43, 45, 46, 47, 49, 51, 55, 56, 62, 68, 69, 78, 80, 81, 96, 111, 124, 127, 127:1, 129, 138, 145, 150, 175, 183, 215, 225, 230, 258, 260, 264, 271, 277, 281, 290, 324, 344 and 350, and C.I. Acid Green 25, 27, 36, 37, 38, 40, 41, 42, 44, 54 and 95;

indigo-based acid dyes such as C.I. Acid Blue 74;

triarylmethane-based acid dyes such as C.I. Acid Violet 15, 16, 17, 19, 21, 23, 24, 25, 38, 49 and 72, C.I. Acid Blue 1, 3, 5, 7, 9, 19, 22, 83, 90, 93, 100, 103, 104 and 109, and C.I. Acid Green 3, 5, 6, 7, 8, 9, 11, 15, 16, 22 and 50;

phthalocyanine-based acid dyes such as C.I. Acid Blue 249 and C.I. Direct Blue 86; and azo-based acid dye such as C.I. Acid Yellow 11, C.I. Acid Orange 7, C.I. Acid Red 37, 180 and 183, C.I. Acid Blue 29, C.I. Direct Red 28 and 83, C.I. Direct Yellow 12, C.I. Direct Orange 26, C.I. Direct Green 59, C.I. Reactive Yellow 2, C.I. Reactive Red 17, C.I. Reactive Red 120, C.I. Reactive Black 5, C.I. Mordant Red 7, C.I. Mordant Yellow 5, C.I. Mordant Black 7, and C.I. Direct Green 28.

(Laking Agent)

The zirconium compound used as the laking agent of the zirconium lake color material of the acid dye, is not particularly limited. As the zirconium compound, examples include, but are not limited to, dichlorooxozirconium, chlorohydroxyoxozirconium, zirconium nitrate, basic zirconium carbonate, basic zirconium sulfate and hydrates thereof.

In an embodiment of the present invention, the zirconium lake color material of the acid dye has excellent dispersibility and can form a high-contrast, high-luminance coating film. From the viewpoint of enhancing these effects further, the laking agent of the zirconium lake color material of the acid dye is preferably a zirconium compound that can form a basic polynuclear condensed ion.

From the point of view that basic polynuclear condensed ions can be easily formed in solutions and the lake color material obtains excellent dispersibility, the laking agent is preferably at least one selected from the group consisting of dichlorooxozirconium, chlorohydroxyoxozirconium and hydrates thereof, and particularly preferably at least one of dichlorooxozirconium and hydrates thereof.

As the zirconium compound, a commercially-available product can be used. As the commercially-available product of dichlorooxozirconium, examples include, but are not limited to, Zircosol ZC and Zircosol ZC-20 (product names, manufactured by Daiichi Kigenso Kagaku Kogyo Co., Ltd.) As the commercially-available product of chlorohydroxyoxozirconium, examples include, but are not limited to, Zircosol ZC-2 (product name, manufactured by Daiichi Kigenso Kagaku Kogyo Co., Ltd.)

The zirconium lake color material of the acid dye can be obtained by mixing a desired acid dye and a desired zirconium compound in a solvent. In particular, for example, there may be mentioned the following methods: (1) a method in which a desired acid dye and a desired zirconium compound are added to a solvent in which the acid dye and the zirconium compound serving as the laking agent are soluble, and they are stirred and mixed together, with heating or cooling as needed; and (2) a method in which a desired acid dye solution and a laking agent solution containing a desired zirconium compound, are separately prepared, and the acid dye solution and the laking agent solution are mixed together, with heating or cooling as needed.

At the time of laking, the heating temperature is not particularly limited. When water is used as the solvent, the heating temperature can be 5 to 90° C.

The acid dye such as the rhodamine-based acid dye can be synthesized by reference to known synthesis methods, such as the synthesis method described in "Shin senryo kagaku" (author: Yutaka Hosoda, publisher: Gihodo Shuppan Co., Ltd.) Or, a commercially-available product can be used as the acid dye.

<Other Color Material>

For the purpose of color tone control, the color material (A) used in an embodiment of the present invention can further contain other color material to an extent that does not impair the effect of the present invention. As the other color material, examples include, but are not limited to, known pigments and dyes. The other color material is not particularly limited, as long as the effect of the present invention are not impaired, and can be the same as the case of the below-described color resin composition for a color filter.

In an embodiment of the present invention, it is preferable that the color material (A) further contains the color material represented by the following general formula (I), from the viewpoint of obtaining a color resin composition for a color filter, the composition having excellent dispersibility and being capable of forming a high-contrast, high-luminance coating film with a desired controlled color tone. From the point of view that a high-contrast, high-luminance coating film can be formed, it is particularly preferable to use a combination of the zirconium lake color material of the rhodamine-based acid dye and the color material represented by the following general formula (I):

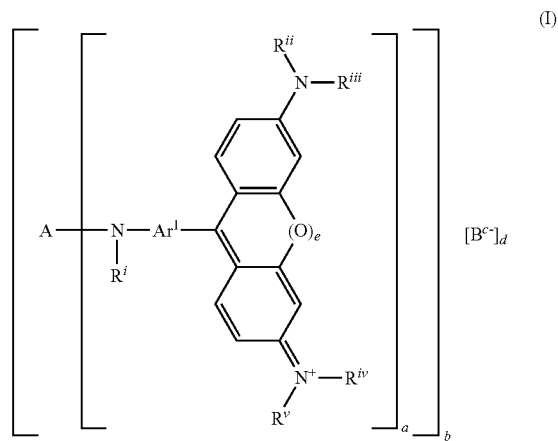

wherein the symbols in the general formula (I) are as descried above.

The cationic moiety in the color material represented by the general formula (I) can be the same as the cationic moiety in the color material represented by the general formula (I) described in International Publication No. WO2012/144521.

In the general formula (I), "A" is an "a"-valent organic group in which a carbon atom directly bound to "N" (nitrogen atom) has no n bond. The organic group is an aliphatic hydrocarbon group having a saturated aliphatic hydrocarbon group at least at a terminal position directly bound to "N", or an aromatic group having the aliphatic hydrocarbon group, and O (oxygen atom), S (sulfur atom), N (nitrogen atom) can be contained in a carbon chain of the organic group. Since the carbon atom directly bound to "N" has no n bond, the color characteristics of the cationic color-forming moiety, such as color tone and transmittance, are not affected by the linking group A and other color-forming moieties, thereby allowing the same color as that of a single color-forming moiety.

In "A", as long as the carbon atom being at the terminal position and directly bound to "N" has no n bond, the aliphatic hydrocarbon group having a saturated aliphatic hydrocarbon group at least at a terminal position directly bound to "N", can be in a straight-chain, branched-chain or cyclic form, have an unsaturated bond in carbon atoms except the one in the terminal position, have a substituent group, or contain O, S, N in the carbon chain. For example, a carbonyl group, a carboxyl group, an oxycarbonyl group and/or an amide group can be contained, and a hydrogen atom can be substituted by a halogen atom, etc.

Also in "A", as the aromatic group having an aliphatic hydrocarbon group, examples include, but are not limited to, a monocyclic or polycyclic aromatic group which has an aliphatic hydrocarbon group having a saturated aliphatic hydrocarbon group at least at the terminal position directly bound to "N". The aromatic group can have a substituent group, and it can be a heterocyclic ring containing O, S, N.

Particularly, from the viewpoint of skeleton toughness, it is preferable that "A" contains a cyclic aliphatic hydrocarbon group or an aromatic group.

As the cyclic aliphatic hydrocarbon group, a bridged alicyclic hydrocarbon group is particularly preferred from the viewpoint of skeleton toughness. The bridged alicyclic hydrocarbon group refers to a polycyclic aliphatic hydrocarbon group having a bridged structure in the aliphatic ring and having a polycyclic structure. As the bridged alicyclic hydrocarbon group, examples include, but are not limited to, norbornane, bicyclo[2,2,2]octane and adamantane. Of bridged alicyclic hydrocarbon groups, norbornane is preferred. As the aromatic group, examples include, but are not limited to, groups containing a benzene ring and those containing a naphthalene ring. Of them, groups containing a benzene ring are preferred.

From the viewpoint of ease of availability of raw materials, "A" is preferably divalent to tetravalent, more preferably divalent or trivalent, and still more preferably divalent. For example, when "A" is a divalent organic group, as the divalent organic group, examples include, but are not limited to, a straight-chain, branched-chain or cyclic alkylene group having 1 to 20 carbon atoms, and an aromatic group in which two alkylene groups each having 1 to 20 carbon atoms are bound by substitution, such as a xylylene group.

The alkyl group as $R^i$ to $R^v$ is not particularly limited. As the alkyl group, examples include, but are not limited to, a straight- or branched-chain alkyl group having 1 to 20 carbon atoms. Of them, preferred is a straight- or branched-chain alkyl group having 1 to 8 carbon atoms, and more preferred is a straight- or branched-chain alkyl group having 1 to 5 carbon atoms, from the viewpoint of ease of production and availability of raw materials. Of them, still more preferred is an ethyl group or a methyl group. A substituent group that the alkyl group can have is not particularly limited. As the substituent group, examples include, but are not limited to, an aryl group, a halogen atom and a hydroxyl group. As the substituted alkyl group, examples include, but are not limited to, a benzyl group.

The aryl group as $R^i$ to $R^v$ is not particularly limited. As the aryl group, examples include, but are not limited to, a phenyl group and a naphthyl group. As a substituent group that the aryl group can have, examples include, but are not limited to, an alkyl group and a halogen atom.

"$R^{ii}$ and $R^{iii}$ can be bound to form a ring structure, and/or $R^{iv}$ and $R^v$ can be bound to form a ring structure" means that $R^{ii}$ and $R^{iii}$ form a ring structure through a nitrogen atom, and/or $R^{iv}$ and $R^v$ form a ring structure through a nitrogen atom. The ring structure is not particularly limited, and as the ring structure, examples include, but are not limited to, a pyrrolidine ring, a piperidine ring and a morpholine ring.

Especially from the viewpoint of chemical stability, it is preferable that each of $R^i$ to $R^v$ is independently a hydrogen atom, an alkyl group having 1 to 5 carbon atoms, or a phenyl group. Or, it is preferable that $R^{ii}$ and $R^{iii}$ are bound to form a pyrrolidine ring, a piperidine ring or a morpholine ring, and/or $R^{iv}$ and $R^v$ are bound to form a pyrrolidine ring, a piperidine ring or a morpholine ring.

Each of $R^i$ to $R^v$ can independently have the above structure. Particularly, from the viewpoint of color purity, it is preferable that $R^i$ is a hydrogen atom. From the viewpoint of ease of production and availability of raw materials, it is more preferable that all of $R^{ii}$ to $R^v$ are the same.

The divalent aromatic group as $Ar^1$ is not particularly limited. The aromatic group can be an aromatic hydrocarbon group composed of a carbon ring, or a heterocyclic group. As the aromatic hydrocarbon in the aromatic hydrocarbon group, examples include, but are not limited to, a benzene ring; condensed polycyclic aromatic hydrocarbon such as a naphthalene ring, a tetralin ring, an indene ring, a fluorene ring, an anthracene ring and a phenanthrene ring; and chain polycyclic hydrocarbons such as biphenyl, terphenyl, diphenylmethane, triphenylmethane and stilbene. The chain polycyclic hydrocarbons can have O, S, N in the chain skeleton, such as diphenyl ether. Meanwhile, as the heterocyclic ring in the heterocyclic group, examples include, but are not limited to, 5-membered heterocyclic rings such as furan, thiophene, pyrrole, oxazole, thiazole, imidazole and pyrazole; 6-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumarin, benzo-pyrone, quinoline, isoquinoline, acridine, phthalazine, quinazoline and quinoxaline. These aromatic groups can have a substituent group.

As the substituent group that the aromatic group can have, examples include, but are not limited to, an alkyl group having 1 to 5 carbon atoms and a halogen atom.

$Ar^1$ is preferably an aromatic group having 6 to 20 carbon atoms, and more preferably an aromatic group having a condensed polycyclic carbon ring having 10 to 14 carbon atoms. $Ar^1$ is still more preferably a phenylene group or a naphthylene group, from the point of view that the structure is simple and the raw materials are low-cost.

A plurality of $R^i$s per molecule can be the same or different; a plurality of $R^{ii}$s per molecule can be the same or different; a plurality of $R^{iii}$s per molecule can be the same or different; a plurality of $R^{iv}$s per molecule can be the same or different; a plurality of $R^v$s per molecule can be the same or different; and a plurality of $Ar^1$s per molecule can be the same or different. The color-forming moieties show the same color when, in all of the moieties, $R^i$s are the same; $R^{ii}$s are the same; $R^{iii}$s are the same; $R^{iv}$s are the same; $R^v$s are the same; and $Ar^1$s are the same. In this case, therefore, the color material can reproduce the same color as that of a single color-forming moiety, which is preferred from the viewpoint of color purity. On the other hand, in the case where at least one of $R^i$ to $R^v$ and $Ar^1$ is a different substituent group, it is possible to reproduce a color obtained from a mixture of several kinds of color-forming moieties, so that it is possible to produce a desired color.

The anion ($B^{c-}$) in the color material represented by the general formula (I) is a divalent or higher polyoxometalate anion. The polyoxometalate anion can be isopolyoxometalate ion $(M_mO_n)^{d-}$ or heteropolyoxometalate ion $(X_lM_mO_n)^{d-}$. In the ionic formulae, "M" is a polyatom; "X" is a heteroatom; "m" is the compositional ratio of the polyatom; and "n" is the compositional ratio of the oxygen atom. As the polyatom (M), examples include, but are not limited to, Mo, W, V, Ti and Nb. As the heteroatom (X), examples include, but are not limited to, Si, P, As, S, Fe and Co. A counter cation such as $Na^+$ or $H^+$ can be contained in a part of the polyoxometalate anion.

From the viewpoint of high luminance and excellent heat resistance and light resistance, preferred is a polyoxometalate anion containing at least one of tungsten (W) and molybdenum (Mo). From the viewpoint of heat resistance, more preferred is a polyoxometalate anion which contains at least tungsten and which can contain molybdenum.

As the polyoxometalate anion containing at least one of tungsten (W) and molybdenum (Mo), examples include, but are not limited to, a tungstate ion $[W_{10}O_{32}]^{4-}$ and a molybdate ion $[Mo_6O_{19}]^{2-}$, which are isopolyoxometalates, and phosphotungstate ions $[PW_{12}O_{40}]^{3-}$ and $[P_2W_{18}O_{62}]^{6-}$, a silicotungstate ion $[SiW_{12}O_{40}]^{4-}$, a phosphomolybdate ion $[PMo_{12}O_{40}]^{3-}$, a silicomolybdate ion $[SiMo_{12}O_{40}]^{4-}$, phosphotungstic molybdate ions $[PW_{12-x}Mo_xO_{40}]^{3-}$ (where x is an integer of 1 to 11) and $[P_2W_{18-y}Mo_yO_{62}]^{6-}$ (where y is an integer of 1 to 17) and a silicotungstic molybdate ion $[SiW_{12-x}Mo_xO_{40}]^{4-}$ (where x is an integer of 1 to 11), which are all heteropolyoxometalates. Of these examples, from the viewpoint of heat resistance and availability of raw materials, the polyoxometalate anion containing at least one of tungsten (W) and molybdenum (Mo) is preferably a heteropolyoxometalate, and more preferably a heteropolyoxometalate containing phosphorus (P).

In the polyoxometalate anion containing at least tungsten (W), the content ratio of the tungsten to molybdenum is not particularly limited. Particularly from the viewpoint of excellent heat resistance, the molar ratio of the tungsten to molybdenum is preferably 100:0 to 85:15, and more preferably 100:0 to 90:10.

As the polyoxometalate anion ($B^{c-}$), the above-mentioned polyoxometalate anions can be used alone or in combination of two or more kinds. In the case of using a combination of two or more kinds of the above-mentioned polyoxometalate anions, the molar ratio of the tungsten to molybdenum in the whole polyoxometalate anion is preferably in the above range.

The color material represented by the general formula (I) can be a double salt that further contains other cation or anion, to an extent that does not impair the effect of the present invention. As the cation, examples include, but are not limited to, other basic dyes; organic compounds containing a functional group that can form a salt with an anion, such as an amino group, a pyridine group or an imidazole group; and metal ions such as a sodium ion, a potassium ion, a magnesium ion, a calcium ion, a copper ion and an iron ion. As the anion, examples include, but are not limited to, other acid dyes; halide ions such as a fluoride ion, a chloride ion and a bromide ion; and inorganic acid anions. As the inorganic acid anions, examples include, but are not limited to, oxo acid anions such as a phosphate ion, a sulfate ion, a chromate ion, a tungstate ion ($WO_4^{2-}$) and a molybdate ion ($MoO_4^{2-}$).

The average dispersed particle diameter of the color material (A) used in an embodiment of the present invention, is not particularly limited, as long as a desired color can be obtained when the color material is formed into the color layer of a color filter. From the viewpoint of obtaining excellent dispersibility, increasing contrast and luminance, and obtaining excellent heat resistance and light resistance, the average dispersed particle diameter is preferably in a range of from 10 to 200 nm, and more preferably in a range of from 20 to 150 nm. By setting the average dispersed particle diameter of the color material (A) within the range, the liquid crystal display device and light-emitting display device produced by the use of the color material dispersion liquid for a color filter according to an embodiment of the present invention, can have high contrast and high quality.

The average dispersed particle diameter of the color material (A) in the color material dispersion liquid is the dispersed particle diameter of the color material particles dispersed in a dispersion medium that contains at least a solvent, and it is measured with a laser scattering particle size distribution analyzer. The average dispersed particle diameter can be measured as follows with a laser scattering particle size distribution analyzer: the color material dispersion liquid is appropriately diluted with the solvent used for the color material dispersion liquid to a concentration that is measurable with a laser scattering particle size distribution analyzer (e.g., 1,000-fold) and then measured with a laser scattering particle size distribution analyzer (e.g., Nanotrac Particle Size Analyzer UPA-EX150 manufactured by Nikkiso Co., Ltd.) by a dynamic light scattering method at 23° C. This average dispersed particle diameter is a volume average particle diameter.

In the color material dispersion liquid according to an embodiment of the present invention, the content of the color material is not particularly limited. From the viewpoint of dispersibility and dispersion stability, the content of the color material is preferably in a range of from 3 to 40% by mass, and more preferably in a range of from 5 to 20% by mass, with respect to the total amount of the color material dispersion liquid.

Also in the color material dispersion liquid according to an embodiment of the present invention, in the case of mixing the zirconium lake color material of the acid dye with the color material represented by the general formula (I), the mixing ratio can be appropriately determined, in order to obtain a desired color tone, and it is not particularly limited. From the viewpoint of color control for a blue color layer application of a color filter, the mass ratio of the zirconium lake color material of the acid dye to the color material represented by the general formula (I) is preferably 50:50 to 1:99, and more preferably 30:70 to 5:95.

[(B) Dispersant]

In the color material dispersion liquid according to an embodiment of the present invention, the color material (A) is dispersed in the solvent by the dispersant (B) for use. The dispersant (B) can be appropriately selected from those that are conventionally used as dispersants. As the dispersant, examples include, but are not limited to, surfactants such as cationic, anionic, nonionic, amphoteric, silicone-based and fluorine-based surfactants. Of surfactants, a polymer surfactant (a polymer dispersant) is preferred from the point of view that it can homogeneously and finely disperse the color material. As the dispersant (B), these dispersants can be used alone or in combination of two or more kinds.

As the polymer dispersant, examples include, but are not limited to, (co)polymers of unsaturated carboxylic acid esters such as polyacrylic acid ester; (partial) amine salts, (partial) ammonium salts and (partial) alkylamine salts of (co)polymers of unsaturated carboxylic acids such as polyacrylic acid; (co)polymers of hydroxyl group-containing unsaturated carboxylic acid esters such as hydroxyl group-containing polyacrylic acid ester, and modified products thereof; polyurethanes; unsaturated polyamides; polysiloxanes; long-chain polyaminoamide phosphates; polyethyleneimine derivatives (amide and salts thereof, obtained by reaction of poly(lower alkyleneimine) and polyester having a free carboxyl group); and polyallylamine derivatives (reaction products obtained by reaction of polyallylamine and one or more compounds selected from the group consisting of the following three kinds of compounds: polyester having a free carboxyl group, polyamide, and a co-condensate of ester and amide (polyester amide)).

Commercially-available products of such dispersants include Disperbyk-2000 and 2001, and BYK-LPN 6919 and 21116 (product names, manufactured by BYK Japan KK) and AJISPER PB821 and 881 (product names, manufactured by Ajinomoto Co., Inc.), for example. Of them, BYK-LPN 6919 and 21116 are preferred from the viewpoint of heat resistance, electric reliability and dispersibility.

From the point of view that the color material (A) can be appropriately dispersed and excellent dispersion stability can be achieved, the polymer dispersant is particularly preferably one or more kinds selected from the group consisting of a polymer having at least a constitutional unit represented by the following general formula (III) and urethane-based dispersants composed of compounds having one or more urethane bonds (—NH—COO—) per molecule.

Hereinafter, the preferred dispersant will be described in detail.

<Polymer Having at Least a Constitutional Unit Represented by the Following General Formula (III)>

In an embodiment of the present invention, a polymer having at least a constitutional unit represented by the following general formula (III) can be preferably used as the dispersant (B):

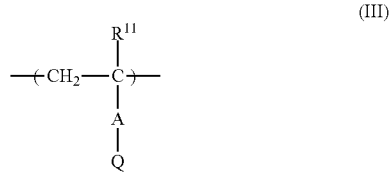

wherein $R^{11}$ is a hydrogen atom or a methyl group; "A" is a direct bond or a divalent linking group; "Q" is a group represented by the following general formula (III-a) or a nitrogen-containing heterocyclic group which can form a salt and which can have a substituent group:

wherein each of $R^{12}$ and $R^{13}$ is independently a hydrogen atom or a hydrocarbon group which can contain a heteroatom, and $R^{12}$ and $R^{13}$ can be the same or different from each other.

In the general formula (III), "A" is a direct bond or a divalent linking group. The direct bond means that "Q" is directly bound to a carbon atom in the general formula (III), not through a linking group.

As the divalent linking group as "A", examples include, but are not limited to, an alkylene group having 1 to 10 carbon atoms, an arylene group, a —CONH— group, a —COO— group, an ether group having 1 to 10 carbon atoms (—R'—OR"— where each of R' and R" is independently an alkylene group) and combinations thereof.

From the viewpoint of dispersibility, "A" in the general formula (III) is preferably a direct bond or a divalent linking group containing a —CONH— group or a —COO— group.

The above dispersants can be particularly preferably used by allowing the constitutional unit represented by the general formula (III) of the dispersants to form a salt by the below-described salt forming agent, at a desired ratio.

As the polymer having the constitutional unit represented by the general formula (III), block and graft copolymers having structures disclosed in International Publication No. WO2011/108495 and Japanese Patent Application Laid-Open (JP-A) Nos. 2013-054200, 2010-237608 and 2011-75661 are particularly preferred, from the point of view that the dispersibility and dispersion stability of the color material and the heat resistance of the resin composition can be increased, and a high-luminance and high-contrast color layer can be formed.

Commercially-available products of the polymers having the constitutional unit represented by the general formula (III) include BYK-LPN 6919.

(Salt Forming Agent)

In an embodiment of the present invention, the dispersant is preferably a polymer in which at least a part of a nitrogen site of the constitutional unit represented by the general formula (III) forms a salt (hereinafter, this state may be referred to as "salt-modified").

In an embodiment of the present invention, by allowing the nitrogen site of the constitutional unit represented by the general formula (III) to form a salt using the salt forming agent, the dispersant strongly adsorbs to the color material similarly forming a salt, so that the dispersibility and dispersion stability of the color material are increased. As the salt forming agent, acidic organophosphorus compounds, organic sulfonic acid compounds and quaternizing agents, which are disclosed in International Publication No. WO2011/108495 and JP-A No. 2013-054200, can be preferably used. Especially when the salt forming agent is an acidic organophosphorus compound, salt-forming moieties containing the acidic organophosphorus compound of the dispersant are localized on the surface of the color material particles, and thus the color material surface reaches a state of being covered with phosphate. Therefore, attacks on the dye skeleton of the color material by active oxygen (hydrogen abstraction) are inhibited, so that the heat resistance and light resistance of the color material containing the dye skeleton are increased. For this reason, color deterioration by high-temperature heating can be further inhibited by the use of the polymer salt-modified by the acidic organophosphorus compound as the dispersant, while the color material (A) having high transmittance and being used in an embodiment of the present invention is in a state of being sufficiently dispersed. Therefore, a color layer which shows higher luminance even after it undergoes the high-temperature heating of the color filter production step, can be formed.

<Urethane-Based Dispersant>

The urethane-based dispersant that is preferably used as the dispersant, is a dispersant composed of a compound having one or more urethane bonds (—NH—COO—) per molecule.

Excellent dispersion is possible by the use of a small amount of the urethane-based dispersant. By making the amount of the dispersant small, the amount of a cure component, etc., can be relatively large. As a result, a color layer with excellent heat resistance can be formed.

In an embodiment of the present invention, the urethane-based dispersant is preferably a reaction product of (1) polyisocyanates having two or more isocyanate groups per molecule and (2) one or more kinds selected from polyesters having a hydroxyl group at a single terminal or both terminals thereof and poly(meth) acrylates having a hydroxyl group at a single terminal or both terminals thereof. The urethane-based dispersant is more preferably a reaction product of (1) polyisocyanates having two or more isocyanate groups per molecule, (2) one or more kinds selected from polyesters having a hydroxyl group at a single terminal or both terminals thereof and poly(meth) acrylates having a hydroxyl group at a single terminal or both terminals thereof, and (3) a compound having an active hydrogen and a basic or acidic group per molecule.

Commercially-available, urethane-based dispersants include Disperbyk-161, 162, 163, 164, 167, 168, 170, 171, 174, 182, 183, 184 and 185, and BYK-9077 (product names, manufactured by BYK Japan KK), AJISPER PB711 (product name, manufactured by Ajinomoto Co., Inc.) and EFKA-46, 47 and 48 (product names, manufactured by EFKA CHEMICALS). Of them, Disperbyk-161, 162, 166, 170 and 174 are preferred from the viewpoint of heat resistance, electric reliability and dispersibility.

As the dispersant (B), these dispersants can be used alone or in combination of two or more kinds.

In the color material dispersion liquid according to an embodiment of the present invention, from the viewpoint of dispersibility, dispersion stability and film properties, generally, the content of the dispersant (B) is preferably in a range of from 1 to 50% by mass, and more preferably in a range of from 1 to 20% by mass, with respect to the total amount of the color material dispersion liquid.

[(C) Solvent]

In an embodiment of the present invention, the solvent (C) can be appropriately selected from solvents which are unreactive with components in the color material dispersion liquid or in the below-described color resin composition and which can dissolve or disperse them. As the solvent (C), examples include, but are not limited to, organic solvents such as alcohol-based solvents, ether alcohol-based solvents, ester-based solvents, ketone-based solvents, ether alcohol acetate-based solvents, ether-based solvents, aprotic amide-based solvents, lactone-based solvents, unsaturated hydrocarbon-based solvents and saturated hydrocarbon-based solvents. Of them, ester-based solvents are preferred from the viewpoint of solubility upon dispersion and coating properties.

Preferred ester-based solvents include methyl methoxypropionate, ethyl ethoxypropionate, methoxy ethyl acetate, propylene glycol monomethyl ether acetate, 3-methoxy-3-methyl-1-butyl acetate, 3-methoxybutyl acetate, methoxybutyl acetate, ethoxy ethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate, for example.

Of them, propylene glycol monomethyl ether acetate (PGMEA) is preferred from the point of view that it has a low risk to the human body and has fast heat-drying properties although it has low volatility at around room temperature. In this case, there is such an advantage that a special washing step is not needed when switching from a color material dispersion liquid comprising conventional PGMEA.

These solvents can be used alone or in combination of two or more kinds.

The color material dispersion liquid according to an embodiment of the present invention is prepared by the use of the solvent (C) generally in an amount of from 45 to 95% by mass, and the amount of the solvent (C) used is preferably from 60 to 85% by mass, with respect to the total amount of the color material dispersion liquid. As the solvent amount decreases, the viscosity increases and the dispersibility decreases. As the solvent amount increases, the color material concentration decreases and may result in a difficulty in achieving a target chromaticity coordinate after preparation of the color resin composition for a color filter.

(Other Components)

The color material dispersion liquid according to an embodiment of the present invention can further contain a dispersion assisting resin and other components as needed, as long as the effect of the present invention are not impaired.

As the dispersion assisting resin, examples include, but are not limited to, an alkali soluble resin that will be mentioned below under "Binder component". The particles of the color material becomes less likely to contact with each other due to steric hindrance by the alkali soluble resin, resulting in stabilization of particle dispersion, and the particle dispersion stabilization effect may be effective in reducing the dispersant.

As the other components, examples include, but are not limited to, a surfactant, which is used to increase wettability, a silane coupling agent, which is used to increase adhesion properties, a defoaming agent, a cissing inhibitor, an antioxidant, an aggregation inhibitor and an ultraviolet absorber.

The color material dispersion liquid according to an embodiment of the present invention is used as a preliminarily prepared product for preparing the below-described color resin composition for a color filter. That is, the color material dispersion liquid is such a color material dispersion liquid, that it is preliminarily prepared at a stage prior to preparing the below-described color resin composition and the ratio of "the mass of the color material component in the composition"/"the mass of the solid content other than the color material component in the composition" is high. In particular, this ratio ("the mass of the color material component in the composition"/"the mass of the solid content other than the color material component in the composition" ratio) is generally 0.3 or more, preferably 0.5 or more, and still more preferably 1.0 or more. By mixing the color material dispersion liquid with at least a binder component, a color resin composition with excellent dispersibility can be prepared.

<Method for Producing the Color Material Dispersion Liquid>

In an embodiment of the present invention, the method for producing the color material dispersion liquid can be a method which can contain the color material (A), the dispersant (B), the solvent (C) and various kinds of additional components used as needed, and which can homogeneously disperse the color material (A) in the solvent by the dispersant. The color material dispersion liquid can be prepared by mixing them with a known mixing means.

The color material dispersion liquid can be prepared by the following method: the dispersant (B) is mixed with the solvent (C) and stirred to produce a dispersant solution; the dispersant solution is mixed with the color material (A) and, as needed, other component; and the mixture is dispersed with a known stirrer or disperser, thereby preparing the dispersion liquid. Also, the color material dispersion liquid according to an embodiment of the present invention can be prepared as follows: a color material dispersion liquid in which the zirconium lake color material of the acid dye is dispersed and a color material dispersion liquid in which other color material is dispersed, are separately prepared and mixed together, thereby preparing the color material dispersion liquid according to an embodiment of the present invention.

As the disperser used for the dispersion treatment, examples include, but are not limited to, roller mills such as a two-roller mill and a three-roller mill; ball mills such as a vibrating ball mill; paint conditioners; and bead mills such as a continuous disk type bead mill and a continuous annular type bead mill. In the case of using a bead mill, a preferred dispersion condition is that the diameter of the beads used is from 0.03 to 2.00 mm, and more preferably from 0.10 to 1.0 mm.

In particular, a preparatory dispersion is carried out with 2 mm zirconia beads, which is a relatively large bead diameter, and then a main dispersion is further carried out with 0.1 mm zirconia beads, which is a relatively small bead diameter. It is preferable to carry out filtration with a 0.5 to 5.0 μm membrane filter after the dispersion treatment.

2. Color Resin Composition for a Color Filter

The color resin composition for a color filter can be prepared by adding (D) a binder component to the color material dispersion liquid for a color filter according to an embodiment of the present invention.

That is, the color resin composition for a color filter can be one which contains the color material (A), the dispersant (B), the solvent (C) and the binder component (D) and in which the color material (A) contains the zirconium lake color material of the acid dye. The color resin composition for a color filter according to an embodiment of the present invention has excellent dispersibility of the color material and is capable of forming a high-luminance, high-contrast color layer. Especially from the viewpoint of being capable of forming a high-contrast, high-luminance color filter with excellent heat resistance, it is preferable to use a combination of the zirconium lake color material of the rhodamine-based acid dye and the color material represented by the general formula (I) as the color material (A).

The color resin composition contains the color material (A), the dispersant (B), the solvent (C) and the binder component (D), and it can contain other components as needed.

Hereinafter, such a color resin composition for a color filter will be described. However, the color material (A), the dispersant (B) and the solvent (C) will not be described below, since they can be the same as those of the above-described color material dispersion liquid according to an embodiment of the present invention.

[(D) Binder Component]

To provide film-forming properties and surface adhesion properties, the color resin composition for a color filter contains a binder component. To provide sufficient hardness to coating films, the color resin composition preferably contains a curable binder component. The curable binder component is not particularly limited, and conventionally-known curable binder components that are used to form the color layers of color filters, can be appropriately used.

As the curable binder component, examples include, but are not limited to, one containing a photocurable binder component that contains a photocurable resin, which is polymerizable and curable by visible light, ultraviolet, electron beam radiation, etc., or one containing a thermosetting binder component that contains a thermosetting resin, which is polymerizable and curable by heating.

To provide film-forming properties and surface adhesion properties, the color resin composition for a color filter contains a binder component. To provide sufficient hardness to coating films, the color resin composition preferably contains a curable binder component. The curable binder component is not particularly limited, and conventionally-known curable binder components that are used to form the color layers of color filters, can be appropriately used.

As the curable binder component, examples include, but are not limited to, one containing a photocurable binder component that contains a photocurable resin, which is polymerizable and curable by visible light, ultraviolet, electron beam radiation, etc., or one containing a thermosetting binder component that contains a thermosetting resin, which is polymerizable and curable by heating.

Developability is not required of the curable binder component, when color layers can be formed by attaching the color resin composition for a color filter selectively in a pattern onto a substrate (e.g., the ink-jet method). In this case, a known thermosetting or photosensitive binder component that is used to form the color layers of color filters by the ink-jet method, etc., can be appropriately used.

As the thermosetting binder, a combination of a compound having two or more thermosetting functional groups per molecule and a curing agent is generally used. In addition, a catalyst that can promote a thermosetting reaction can be added. As the thermosetting functional groups, examples include, but are not limited to, an epoxy group, an oxetanyl group, an isocyanate group and an ethylenically unsaturated bond. As the thermosetting functional groups, epoxy groups are preferably used. As the thermosetting binder component, examples include, but are not limited to, those mentioned in International Publication No. WO2012/144521.

On the other hand, in the case of using a photolithography process to form color layers, a photosensitive binder component with alkali developability is suitably used.

Hereinafter, photosensitive binder components will be explained. However, the curable binder component used in an embodiment of the present invention is not limited to them. Besides the below-described photosensitive binder components, a thermosetting binder component that is polymerizable and curable by heating, such as epoxy resin, can be further used.

As the photosensitive binder components, examples include, but are not limited to, a positive photosensitive binder component and a negative photosensitive binder component. As the positive photosensitive binder component, examples include, but are not limited to, those containing an alkali soluble resin and an o-quinonediazide group-containing compound, which is a photosensitivity-imparting component.

On the other hand, as the negative photosensitive binder component, those containing at least an alkali soluble resin, a polyfunctional monomer and a photoinitiator, are suitably used.

In the color resin composition for a color filter, the negative photosensitive binder component is preferred, from the point of view that a pattern can be easily formed by a photolithography method, using existing processes.

Hereinafter, the alkali soluble resin, the polyfunctional monomer and the photoinitiator, which constitute the negative photosensitive binder component, will be explained in detail.

(Alkali Soluble Resin)

In an embodiment of the present invention, the alkali soluble resin can be appropriately selected, as long as it has an acidic group, functions as a binder resin, and is soluble in developers used for pattern formation, particularly preferably in an alkaline developer.

In an embodiment of the present invention, the alkali soluble resin is preferably a resin having a carboxyl group as the acidic group. As the resin, examples include, but are not limited to, acrylic copolymers having a carboxyl group and epoxy (meth)acrylate resins having a carboxyl group. Of them, particularly preferred is one having a carboxyl group and, moreover, a photopolymerizable functional group such as an ethylenically unsaturated group in a side chain thereof. This is because the hardness of the cured film thus formed is increased by containing the photopolymerizable functional group. These acrylic copolymers and epoxy (meth) acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group can further contain a constitutional unit having an aromatic carbon ring. The aromatic carbon ring functions as a component that imparts coatability to the color resin composition for a color filter.

The acrylic copolymer having a carboxyl group can further contain a constitutional unit having an ester group. The constitutional unit having an ester group not only functions as a component that inhibits the alkali solubility of the color resin composition for a color filter, but also functions as a component that increases the solubility and re-solubility in solvents.

As the acrylic copolymer having a carboxyl group, examples include, but are not limited to, those described in International Publication No. WO2012/144521. In particular, examples include, but are not limited to, copolymers obtained from a monomer having no carboxyl group, such as methyl (meth)acrylate and ethyl (meth)acrylate, with one or more selected from (meth)acrylic acid and anhydrides thereof. Also, examples include, but are not limited to, polymers obtained by introducing an ethylenically unsaturated bond in the above copolymers by, for example, addition of an ethylenically unsaturated compound having a reactive functional group such as a glycidyl group or hydroxyl group. In an embodiment of the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure, and more stable color filters can be obtained.

The copolymerization ratio of the carboxyl group-containing ethylenically unsaturated monomer in the carboxyl group-containing copolymer is generally from 5 to 50% by mass, and preferably from 10 to 40% by mass. When the copolymerization ratio of the carboxyl group-containing ethylenically unsaturated monomer is less than 5% by mass, the solubility of the coating film thus obtained in alkaline developers is decreased, resulting in a difficulty with pattern formation. When the copolymerization ratio exceeds 50% by mass, upon development with an alkaline developer, a pattern thus formed is likely to come off of the substrate, or the pattern surface is likely to be roughened.

The mass average molecular weight of the carboxyl group-containing copolymer is preferably in a range of from 1,000 to 500,000, and more preferably in a range of from 3,000 to 200,000. When the mass average molecular weight is less than 1,000, there may be a remarkable decrease in binder function after curing. When the mass average molecular weight exceeds 500,000, upon development with an alkaline developer, pattern formation may be difficult. The mass average molecular weight is obtained by gel permeation chromatography (GPC) as a standard polystyrene equivalent.

The epoxy (meth)acrylate resin having a carboxyl group is not particularly limited. As the resin, an epoxy (meth) acrylate compound obtained by reaction of an acid anhydride with a reaction product of an epoxy compound and an unsaturated group-containing monocarboxylic acid, is suitable.

The epoxy compound, the unsaturated group-containing monocarboxylic acid and the acid anhydride can be appropriately selected from known ones. As the epoxy compound, the unsaturated group-containing monocarboxylic acid and the acid anhydride, examples include, but are not limited to, those described in International Publication No. WO2012/144521. As each of the epoxy compound, the unsaturated group-containing monocarboxylic acid and the acid anhydride, those mentioned above can be used alone or in combination of two or more kinds.

The alkali soluble resin used in the color resin composition for a color filter can be one kind of alkali soluble resin or a combination of two or more kinds of alkali soluble resins. The content of the alkali soluble resin is generally in a range of from 10 to 1,000 parts by mass, and preferably in a range of from 20 to 500 parts by mass, with respect to 100 parts by mass of the color material contained in the color resin composition. When the content of the alkali soluble resin is too small, sufficient alkali developability may not be obtained. When the content is too large, the ratio of the color material is relatively small, so that sufficient color density may not be obtained.

(Polyfunctional Monomer)

The polyfunctional monomer used in the color resin composition for a color filter is not particularly limited, as long as it is polymerizable with the below-described photoinitiator. As the polyfunctional monomer, a compound having two or more ethylenically unsaturated double bonds is generally used. Preferably, the polyfunctional monomer is a polyfunctional (meth)acrylate having two or more acryloyl or methacryloyl groups.

Such a polyfunctional (meth)acrylate can be appropriately selected from conventionally known ones. As the polyfunctional (meth)acrylate, examples include, but are not limited to, those mentioned in International Publication No. WO2012/144521.

These polyfunctional (meth)acrylates can be used alone or in combination of two or more kinds. When excellent photocurability (high sensitivity) is required of the color resin composition according to an embodiment of the present invention, the polyfunctional monomer is preferably one having three (trifunctional) or more polymerizable double bonds, and preferably poly(meth) acrylates of trivalent or higher polyalcohols and dicarboxylic acid-modified products thereof. More specifically, preferred are trimethylolpropane tri(meth)acrylate, pentaerythritol tri(meth)acrylate, succinic acid-modified products of pentaerythritol tri(meth) acrylate, pentaerythritol tetra(meth)acrylate, dipentaerythritol tetra(meth)acrylate, dipentaerythritol penta(meth)acrylate, succinic acid-modified products of dipentaerythritol penta(meth)acrylate, dipentaerythritol hexa(meth)acrylate, tris(2-acryloyloxyethyl)phosphate and tris(2-methacryloyloxyethyl)phosphate, for example.

The content of the polyfunctional monomer used in the color resin composition for a color filter is not particularly limited. It is generally from about 5 to 500 parts by mass, and preferably in a range of from 20 to 300 parts by mass, with respect to 100 parts by mass of the alkali soluble resin. When the content of the polyfunctional monomer is smaller than the range, photocuring may not proceed sufficiently and the color resin composition exposed to light may be dissolved. When the content of the polyfunctional monomer is larger than the range, there may be a decrease in alkali developability.

(Photoinitiator)

The photoinitiator used in the color resin composition for a color filter is not particularly limited. As the photoinitiator, conventionally-known various kinds of photoinitiators can be used alone or in combination of two or more kinds. As the photoinitiator, examples include, but are not limited to, those mentioned in International Publication No. WO2012/144521.

The content of the photoinitiator used in the color resin composition for a color filter is generally from about 0.01 to 100 parts by mass, and preferably from 5 to 60 parts by mass, with respect to 100 parts by mass of the polyfunctional monomer. When the content is smaller than the range, sufficient polymerization reaction may not be caused, so that the hardness of the color layer may not be sufficient. When the content is larger than the range, the content of the color material and so on in the solid content of the color resin composition is relatively small, so that sufficient color density may not be obtained.

<Optionally-Added Compounds>

As needed, the color resin composition for a color filter can further contain other color material or various kinds of additives.

(Other Color Material)

Other color material can be added as needed, for the purpose of color tone control. For example, it can be selected from conventionally-known pigments and dyes, according to the purpose, and such pigments and dyes can be used alone or in combination of two or more kinds.

As the other color material, it is particularly preferable to use the color material described in International Publication No. WO2012/144521, which contains the divalent or higher cation represented by the general formula (I) and a divalent or higher anion.

As the other color material, examples include, but are not limited to, the color materials described in International Publication Nos. WO2012/39416 and WO2012/39417; pigments such as C.I. Pigment Violet 1, C.I. Pigment Violet 2, C.I. Pigment Violet 3, C.I. Pigment Violet 19, C.I. Pigment Violet 23, C.I. Pigment Blue 1, C.I. Pigment Blue 15, C.I. Pigment Blue 15:3, C.I. Pigment Blue 15:4, C.I. Pigment Blue 15:6, C.I. Pigment Blue 60, C.I. Pigment Red 81 and C.I. Pigment Red 82; and dyes such as Acid Red.

In the case of using the other color material, the content is not particularly limited. Especially in the case of using the color material described in International Publication No. WO2012/144521 as the other color material, which contains the divalent or higher cation represented by the general formula (I) and a divalent or higher anion, the color material can be preferably used in a desired amount.

The content of the other color material can be determined to an extent that does not impair the effect of the present invention. It is preferably 95 parts by mass or less, and more preferably 90 parts by mass or less, with respect to 100 parts by mass (the total amount) of the color material (A).

(Antioxidant)

From the viewpoint of heat resistance and light resistance, it is preferable that the color resin composition for a color filter further contains an antioxidant. The antioxidant can be appropriately selected from conventionally-known antioxidants. As the antioxidant, examples include, but are not limited to, a hindered phenol-based antioxidant, an amine-based antioxidant, a phosphorus-based antioxidant, a sulfur-based antioxidant and a hydrazine-based antioxidant. From the viewpoint of heat resistance, it is preferable to use a hindered phenol-based antioxidant.

The hindered phenol-based antioxidant means an antioxidant that contains at least one phenol structure in which at least one of the 2- and 6-positions of the hydroxyl group is substituted with a substituent group having 4 or more carbon atoms.

In the case of using the antioxidant, the amount is not particularly limited, as long as it is in a range that does not impair the effect of the present invention. The amount of the antioxidant used is preferably from 0.1 to 5.0 parts by mass, and more preferably from 0.5 to 4.0 parts by mass, with respect to 100 parts by mass (the total solid content) of the color resin composition. When the amount of the antioxidant used is equal to or more than the lower limit, excellent heat resistance can be obtained. On the other hand, when the amount is equal to or less than the upper limit, the color resin composition can be a highly-sensitive photosensitive resin composition.

(Other Additives)

As the additives, examples include, but are not limited to, the above-mentioned antioxidant, a polymerization inhibitor, a chain transfer agent, a leveling agent, a plasticizer, a surfactant, a defoaming agent, a silane coupling agent, an ultraviolet absorber and an adhesion enhancing agent.

As the surfactant and the plasticizer, examples include, but are not limited to, those mentioned in International Publication No. WO2012/144521.

<The Content of Each Component in the Color Resin Composition>

The total content of the color material (A) is preferably from 3 to 65% by mass, and more preferably from 4 to 55% by mass, with respect to the total solid content of the color resin composition. When the total content is equal to or more than the lower limit, the color layer obtained by applying the color resin composition for a color filter to a predetermined thickness (generally from 1.0 to 5.0 µm) can have sufficient color density. When the total content is equal to or less than the upper limit, excellent dispersibility and dispersion stability can be obtained, and a color layer with sufficient hardness and adhesion to the substrate can be obtained. In an embodiment of the present invention, "solid content" includes all the above-described components other than the solvent, and it also includes the polyfunctional monomer in a liquid form.

Also, the content of the dispersant (B) is not particularly limited, as long as the color material (A) can be homogeneously dispersed. For example, the dispersant content is preferably from 3 to 70 parts by mass, with respect to the total solid content of the color resin composition. Also, the content is more preferably from 5 to 60 parts by mass, and particularly preferably from 5 to 50 parts by mass, with respect to the total solid content of the color resin composition. When the content is equal to or more than the lower limit, the color material (A) can have excellent dispersibility and dispersion stability, and it can have excellent storage stability. When the content is equal to or less than the upper limit, excellent developability can be obtained.

The total amount of the binder component (D) is preferably from 10 to 92% by mass, and more preferably from 15 to 87% by mass, with respect to the total solid content of the color resin composition. When the total amount is equal to or more than the lower limit, a color layer with sufficient hardness and adhesion to the substrate can be obtained. When the total amount is equal to or less than the upper limit, excellent developability can be obtained, and generation of fine wrinkles, which is due to heat shrinkage, can be inhibited.

The content of the solvent (C) can be appropriately determined in a range that can form a color layer with accuracy. In general, the content is preferably in a range of from 55 to 95% by mass, and particularly preferably in a range of from 65 to 88% by mass, with respect to the total amount of the color resin composition including the solvent. When the content of the solvent is in the range, excellent coatability can be provided to the color resin composition.

<Method for Producing the Color Resin Composition for a Color Filter>

The method for producing the color resin composition for a color filter is not particularly limited, as long as it is a method in which the color material (A), the dispersant (B), the solvent (C), the binder component (D) and various kinds of additional components that are added as needed are contained, and the color material (A) can be homogeneously dispersed in the solvent (C) by the dispersant (B). The color resin composition can be prepared by mixing them using a known mixing means.

As the method for preparing the color resin composition, examples include, but are not limited to, (1) a method of mixing the color material dispersion liquid according to an embodiment of the present invention with the binder component (D) and various kinds of additional components used as needed; (2) a method of adding the color material (A), the dispersant (B), the binder component (D) and various kinds of additional components used as needed to the solvent (C) at the same time and mixing them; and (3) a method of adding the dispersant (B), the binder component (D) and various kinds of additional components used as needed to the solvent (C), mixing them, adding the color material (A) thereto and then mixing them.

Of these methods, the method (1) is preferred, from the viewpoint of effectively inhibiting the color material from aggregation and homogeneously dispersing the color material.

3. Color Filter

The color filter according to an embodiment of the present invention comprises at least a transparent substrate and color layers disposed on the substrate, wherein at least one of the color layers contains a zirconium lake color material of an acid dye.

Such a color filter according to an embodiment of the present invention will be explained with reference to figures. FIG. 1 is a schematic sectional view of an example of the color filter according to an embodiment of the present invention. According to FIG. 1, a color filter 10, which is the color filter according to an embodiment of the present invention, includes a transparent substrate 1, a light shielding part 2 and a color layer 3.

(Color Layer)

At least one of the color layers used in the color filter according to an embodiment of the present invention, is a color layer that contains at least a zirconium lake color material of an acid dye.

The color layers are generally formed on openings of the light shielding part on the below-described transparent substrate and composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layers is appropriately controlled by controlling the applying method, the solid content concentration, viscosity, etc., of the color resin composition for a color filter. In general, the thickness is preferably in a range of from 1 to 5 µm.

For example, when the color resin composition for a color filter is a photosensitive resin composition, the color layers can be formed by the following method. It is preferable that the color layer containing the zirconium lake color material of the acid dye, which is used in the color filter according to an embodiment of the present invention, is formed using the above-described color resin composition for a color filter according to an embodiment of the present invention, which contains the color material (A), the dispersant (B), the solvent (C) and the binder component (D) and in which the color material (A) contains the zirconium lake color material of the acid dye. It is also preferable that the color layer containing the zirconium lake color material of the acid dye is a cured product of the color resin composition for a color filter.

First, the color resin composition for a color filter is applied onto the below-described transparent substrate by a coating method such as a spray coating method, a dip coating method, a bar coating method, a roll coating method or a spin coating method to form a wet coating film.

Then, the wet coating film is dried with a hot plate, an oven, etc. The dried film is subjected to exposure through a mask with a given pattern to cause a photopolymerization reaction of the alkali soluble resin, the polyfunctional monomer, etc., thereby obtaining a photosensitive coating film. A light source is used for the exposure. As the light source, examples include, but are not limited to, a low pressure mercury lamp, a high pressure mercury lamp and a metal halide lamp, and ultraviolet rays and electron beams. The exposure amount is appropriately controlled, depending on the used light source and the thickness of the coating film.

The film can be heated to promote a polymerization reaction after the exposure. The heating condition is appropriately determined, depending on the content ratio of the components used in the color resin composition for a color filter, the thickness of the coating film, etc.

Next, the thus-obtained film is developed with a developer to dissolve and remove unexposed portions, thereby forming a coating film in a desired pattern. As the developer, a solution obtained by dissolving alkali in water or aqueous solvent, is generally used. An appropriate amount of surfactant, etc., can be added to the alkali solution. The developing method can be selected from general developing methods.

After the developing treatment, generally, the developer is rinsed off, followed by drying of the cured coating film of the color resin composition for a color filter, thereby forming a color layer. To sufficiently cure the coating film, a heating treatment can be carried out after the developing treatment. The heating condition is not particularly limited and is appropriately determined depending on the intended application of the coating film.

(Light Shielding Part)

In the color filter according to an embodiment of the present invention, the light shielding part is formed in pattern on the below-described transparent substrate, and it can be the same as those used in general color filters.

The pattern shape of the light shielding part is not particularly limited. As the pattern shape, examples include, but are not limited to, a stripe-shaped pattern and a matrix-shaped pattern. As the light shielding part, examples include, but are not limited to, one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or it can be a stack of three layers of one $CrO_x$ layer (x is an arbitrary number), one $CrN_y$ layer (y is an arbitrary number) and one Cr layer, the stack of the three layers having a further reduced reflectance.

When the light shielding part is one produced by dispersing or dissolving a black color material in a binder resin, the method for producing the light shielding part is not particularly limited, as long as it is a method that can pattern the light shielding part. As the method, examples include, but are not limited to, a photolithography method using a color resin composition for the light shielding part, a printing method using the same, and an ink-jet method using the same.

When the light shielding part is a thin metal layer, the thickness is from about 0.2 to 0.4 µm. When the light shielding part is formed from the black color material dispersed or dissolved in the binder resin, the thickness is from about 0.5 to 2 µm.

(Transparent Substrate)

The transparent substrate of the color filter according to an embodiment of the present invention is not particularly limited, as long as it is a substrate that is transparent to visible light. It can be selected from general transparent substrates used in color filters. As the transparent substrate, examples include, but are not limited to, inflexible transparent rigid materials such as silica glass plate, non-alkali glass plate and synthetic silica plate, and transparent flexible materials with flexibility and flexible properties, such as transparent resin film, optical resin plate and flexible glass.

The thickness of the transparent substrate is not particularly limited. Depending on the intended application of the color filter according to an embodiment of the present invention, one having a thickness of from about 100 µm to 1 mm can be used, for example.

In addition to the transparent substrate, the light shielding part and the color layer, the color filter according to an embodiment of the present invention can also include an overcoat layer and a transparent electrode layer, for example. Moreover, the color filter according to an embodiment of the present invention can further comprise an orientation layer, a columnar spacer, etc.

4. Liquid Crystal Display Device

The liquid crystal display device according to an embodiment of the present invention comprises the above-described color filter, a counter substrate, and a liquid crystal layer disposed between the color filter and the counter substrate.

Figure 2:
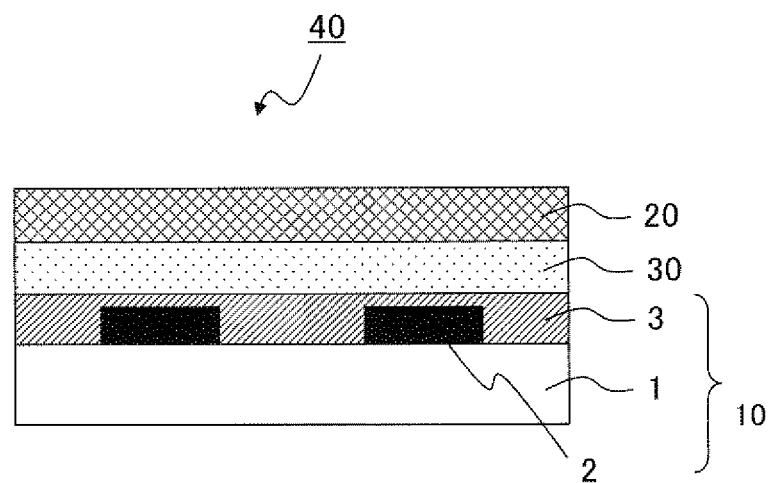
FIG. 2 is a schematic sectional view of an example of the liquid crystal display device according to an embodiment of the present invention.

Such a liquid crystal display device according to an embodiment of the present invention will be explained with reference to a figure. FIG. 2 is a schematic view of an example of the liquid crystal display device according to an embodiment of the present invention. As shown in FIG. 2, a liquid crystal display device 40, which is the liquid crystal display device according to an embodiment of the present invention, includes a color filter 10, a counter substrate 20 including a TFT array substrate, etc., and a liquid crystal layer 30 formed between the color filter 10 and the counter substrate 20.

The liquid crystal display device according to an embodiment of the present invention is not limited to the configuration shown in FIG. 2. It can be a configuration that is generally known as a liquid crystal display device including a color filter.

The method for driving the liquid crystal display device according to an embodiment of the present invention is not particularly limited. It can be selected from driving methods that are generally used in liquid crystal display devices. As such driving methods, examples include, but are not limited to, a TN method, an IPS method, an OCB method and an MVA method. In an embodiment of the present invention, any of these methods can be suitably used.

The counter substrate can be appropriately selected, depending on the driving method, etc., of the liquid crystal display device according to an embodiment of the present invention.

Also, the liquid crystal constituting the liquid crystal layer can be selected from various liquid crystals with varying dielectric anisotropies and mixtures thereof, depending on the driving method, etc., of the liquid crystal display device according to an embodiment of the present invention.

The method for forming the liquid crystal layer can be selected from methods that are generally used to produce liquid crystal cells. As the method, examples include, but are not limited to, a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, while it is in the form of isotropic liquid, using the capillary effect; and the liquid crystal cell is encapsulated with an adhesive agent, thereby forming a liquid crystal layer. Then, the encapsulated liquid crystal can be oriented by gradually cooling the liquid crystal cell to room temperature.

In the liquid crystal dripping method, for example, a sealing agent is applied to the periphery of a color filter; the color filter is heated to the temperature at which the liquid crystal enters an isotropic phase; the liquid crystal is dripped with a dispenser or the like, while it is in the form of isotropic liquid; and the color filter and the counter substrate are stacked under reduced pressure and attached to each other via the applied sealing agent, thereby forming a liquid crystal layer. Then, the encapsulated liquid crystal can be oriented by gradually cooling the liquid crystal cell to room temperature.

5. Light-Emitting Display Device

The light-emitting display device according to an embodiment of the present invention comprises the above-described color filter and a light-emitting body. As the light-emitting display device according to an embodiment of the present invention, examples include, but are not limited to, an organic light-emitting display device comprising an organic light-emitting body as the light-emitting body. The light-emitting body is not limited to the organic light-emitting body, and an inorganic light-emitting body can be appropriately used.

Figure 3:
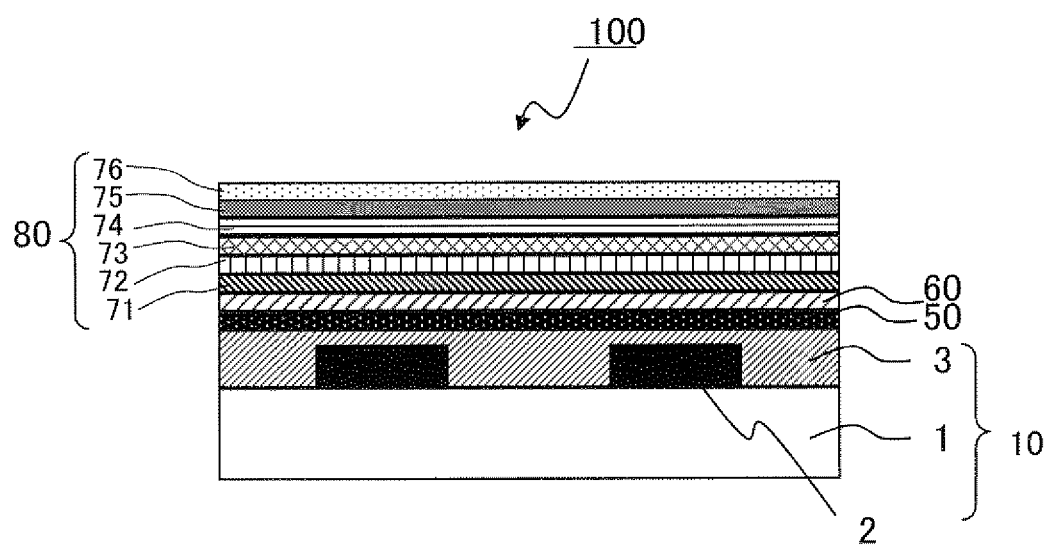
FIG. 3 is a schematic sectional view of an example of the light-emitting display device according to an embodiment of the present invention.

Such a light-emitting display device according to an embodiment of the present invention will be explained with reference to a figure. FIG. 3 is a schematic view of an example of the organic light-emitting display device according to an embodiment of the present invention. As shown in FIG. 3, a light-emitting display device 100, which is the light-emitting display device according to an embodiment of the present invention, includes a color filter 10 and a light-emitting body 80. An organic protection layer 50 and/or an inorganic oxide layer 60 can be disposed between the color filter 10 and the light-emitting body 80.

As the method for stacking the components of the light-emitting body 80, examples include, but are not limited to, a method of stacking a transparent positive electrode 71, a positive hole injection layer 72, a positive hole transport layer 73, a light-emitting layer 74, an electron injection layer 75 and a negative electrode 76 in this sequence on the color filter, and a method of attaching the light-emitting body 80 formed on a different substrate onto the inorganic oxide layer 60. The transparent positive electrode 71, the positive hole injection layer 72, the positive hole transport layer 73, the light-emitting layer 74, the electron injection layer 75, the negative electrode 76 and other components of the light-emitting body 80 can be appropriately selected from conventionally-known materials. The light-emitting display device 100 produced as mentioned above is applicable to both passive and active drive organic EL displays, for example.

The light-emitting display device according to an embodiment of the present invention is not limited to a light-emitting display device of the configuration shown in FIG. 3. It can have any one of configurations that are generally known as those of light-emitting display devices using a color filter.

EXAMPLES

Hereinafter, the present invention will be described in detail, by way of examples. The present invention is not limited by these examples.

Synthesis Example 1: Synthesis of Zirconium Lake Color Material A1

First, 5.00 g of Acid Red 289 (manufactured by Tokyo Chemical Industry Co., Ltd., a rhodamine-based acid dye represented by the following chemical formula (1)) was added to 166 ml of water and dissolved at 80° C. to prepare a dye solution. Then, 5.00 g of ZC-20 (product name, manufactured by Daiichi Kigenso Kagaku Kogyo Co., Ltd.) was added to 200 ml of water, and the mixture was stirred at normal temperature to prepare a dichlorooxozirconium aqueous solution. The dichlorooxozirconium aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 7.67 g of a zirconium lake color material A1.

Chemical Formula (1)

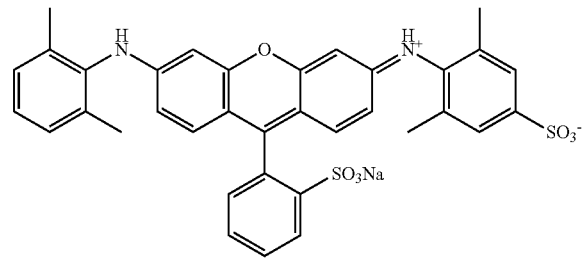

Synthesis Example 2: Synthesis of Zirconium Lake Color Material A2

First, 5.00 g of Acid Red 289 (manufactured by Tokyo Chemical Industry Co., Ltd., a rhodamine-based acid dye represented by the chemical formula (1)) was added to 166 ml of water and dissolved at 80° C. to prepare a dye solution. Then, 5.50 g of ZC-2 (product name, manufactured by Daiichi Kigenso Kagaku Kogyo Co., Ltd.) was added to 200 ml of water, and the mixture was stirred at normal temperature to prepare a chlorohydroxyoxozirconium aqueous solution. The chlorohydroxyoxozirconium aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 7.65 g of a zirconium lake color material A2.

Synthesis Example 3: Synthesis of Zirconium Lake Color Material A3

First, 5.00 g of Acid Red 289 (manufactured by Tokyo Chemical Industry Co., Ltd., a rhodamine-based acid dye represented by the chemical formula (1)) was added to 166 ml of water and dissolved at 80° C. to prepare a dye solution. Then, 2.50 g of zirconium oxychloride octahydrate (manufactured by Wako Pure Chemical Industries, Ltd.) was added to 200 ml of water, and the mixture was stirred at normal temperature to prepare a zirconium oxychloride aqueous solution. The zirconium oxychloride aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 6.24 g of a zirconium lake color material A3.

Synthesis Example 4: Synthesis of Zirconium Lake Color Material B

First, 5.00 g of Acid Red 52 (manufactured by Tokyo Chemical Industry Co., Ltd., a rhodamine-based acid dye represented by the following chemical formula (2)) was added to 166 ml of water and dissolved at normal temperature to prepare a dye solution. Then, 6.00 g of ZC-20 (product name, manufactured by Daiichi Kigenso Kagaku Kogyo Co., Ltd.) was added to 200 ml of water, and the mixture was stirred at normal temperature to prepare a dichlorooxozirconium aqueous solution. The dichlorooxozirconium aqueous solution thus prepared was added to the dye solution in a dropwise manner for 15 minutes, and the mixture was stirred at normal temperature for 1 hour. A precipitate thus produced was obtained by filtration and washed with water. A cake thus obtained was dried, thereby obtaining 3.01 g of a zirconium lake color material B.

Chemical Formula (2)

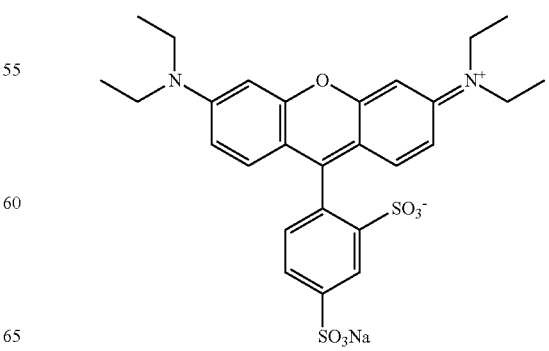

Synthesis Example 5: Synthesis of Zirconium Lake Color Material C

First, 5.00 g of Direct blue 86 (manufactured by Tokyo Chemical Industry Co., Ltd., a phthalocyanine-based acid dye represented by the following chemical formula (3)) was added to 166 ml of water and dissolved at 80° C. to prepare a dye solution. Then, 9.00 g of ZC-20 (product name, manufactured by Daiichi Kigenso Kagaku Kogyo Co., Ltd.) was added to 200 ml of water, and the mixture was stirred at normal temperature to prepare a dichlorooxozirconium aqueous solution. The dichlorooxozirconium aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 4.33 g of a zirconium lake color material C.

Chemical Formula (3)

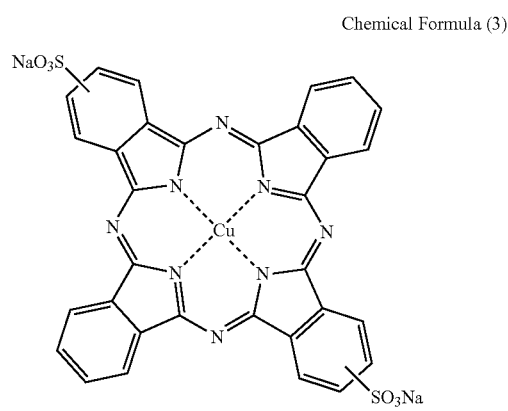

Synthesis Example 6: Synthesis of Zirconium Lake Color Material D

First, 5.00 g of Acid violet 17 (manufactured by Sigma-Aldrich, a triarylmethane-based acid dye represented by the following chemical formula (4)) was added to 166 ml of water and dissolved at 80° C. to prepare a dye solution. Then, 5.00 g of ZC-20 (product name, manufactured by Daiichi Kigenso Kagaku Kogyo Co., Ltd.) was added to 200 ml of water, and the mixture was stirred at normal temperature to prepare a dichlorooxozirconium aqueous solution. The dichlorooxozirconium aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 2.40 g of a zirconium lake color material D.

Chemical Formula (4)

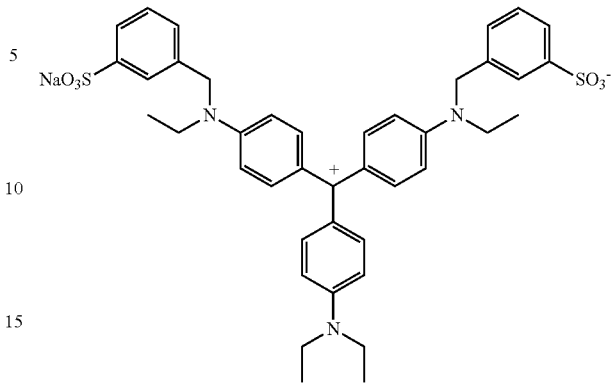

Synthesis Example 7: Synthesis of Zirconium Lake Color Material E

First, 5.00 g of Acid Blue 90 (manufactured by Tokyo Chemical Industry Co., Ltd., a triarylmethane-based acid dye represented by the following chemical formula (5)) was added to 166 ml of water and dissolved at 80° C. to prepare a dye solution. Then, 2.50 g of ZC-20 (product name, manufactured by Daiichi Kigenso Kagaku Kogyo Co., Ltd.) was added to 200 ml of water, and the mixture was stirred at normal temperature to prepare a dichlorooxozirconium aqueous solution. The dichlorooxozirconium aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 5.08 g of a zirconium lake color material E.

Chemical Formula (5)

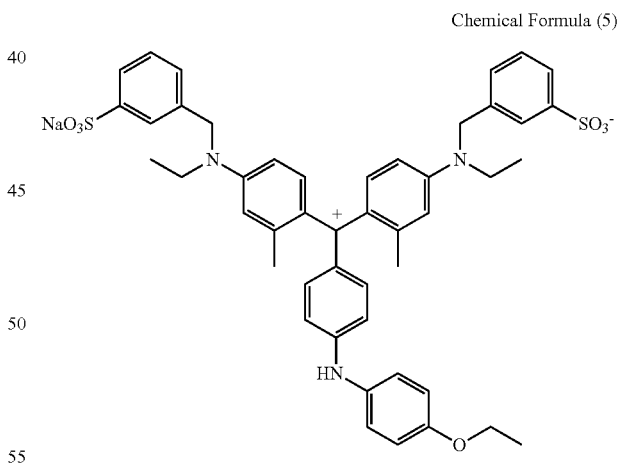

Synthesis Example 8: Synthesis of Zirconium Lake Color Material F

First, 5.00 g of Acid red 183 (manufactured by Sigma-Aldrich, an azo-based acid dye represented by the following chemical formula (6)) was added to 166 ml of water and dissolved at 80° C. to prepare a dye solution. Then, 5.00 g of ZC-20 (product name, manufactured by Daiichi Kigenso Kagaku Kogyo Co., Ltd.) was added to 200 ml of water, and the mixture was stirred at normal temperature to prepare a dichlorooxozirconium aqueous solution, the dichlorooxozirconium aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 2.22 g of a zirconium lake color material F.

Chemical Formula (6)

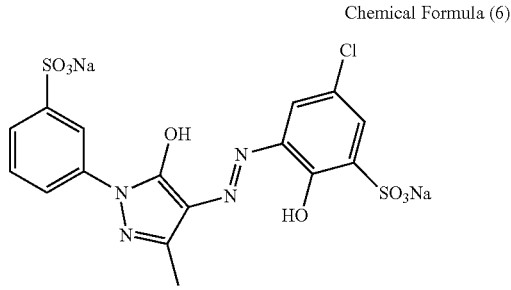

Synthesis Example 9: Synthesis of Blue Lake Color Material α

(1) Synthesis of Intermediate 1

With reference to the method for producing intermediates 3 and 4 described in International Publication No. WO2012/144521, 15.9 g of an intermediate 1 represented by the following chemical formula (7) was obtained.

The compound thus obtained was confirmed to be a target compound from the following analysis results:

MS (ESI) (m/z): 511(+), divalent

Elemental analysis values: CHN measurement values (78.13%, 7.48%, 7.78%); theoretical values (78.06%, 7.75%, 7.69%)

Chemical Formula (7)

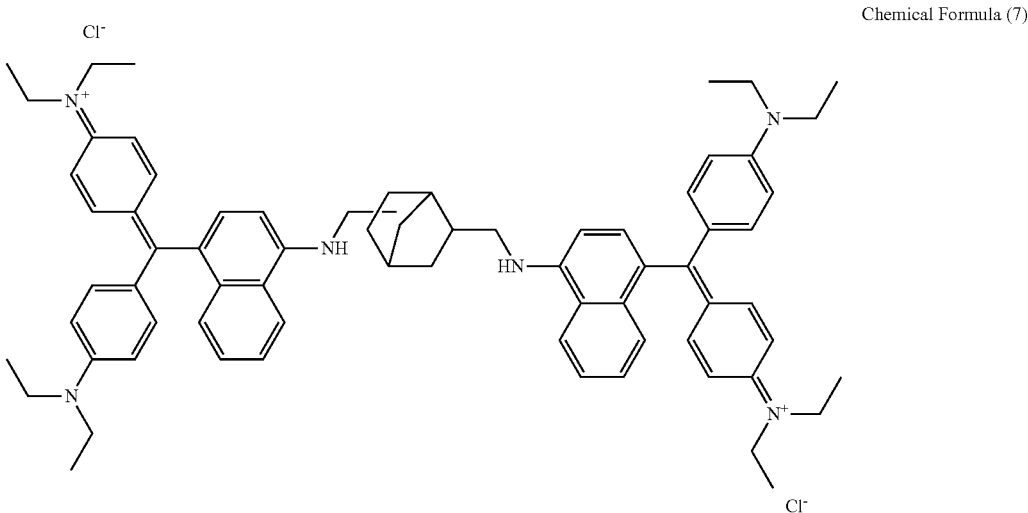

(2) Synthesis of Blue Lake Color Material α

First, 5.00 g (4.58 mmol) of the intermediate 1 was added to 300 ml of water and dissolved at 90° C. to prepare an intermediate 1 solution. Then, 10.44 g (3.05 mmol) of phosphotungstic acid n-hydrate $H_3[PW_{12}O_{40}]\cdot nH_2O$ (manufactured by Nippon Inorganic Colour & Chemical Co., Ltd., n=30) was added to 100 ml of water, and the mixture was stirred at 90° C. to prepare a phosphotungstic acid aqueous solution. The intermediate 1 solution was mixed with the phosphotungstic acid aqueous solution at 90° C. A precipitate thus produced was obtained by filtration and washed with water. A cake thus obtained was dried, thereby obtaining 13.25 g of a blue lake color material α represented by the following chemical formula (8) (yield 98%).

The compound thus obtained was confirmed to be a target compound from the following analysis results (mol ratio W/Mo=100/0):

MS (ESI) (m/z): 510(+), divalent

Elemental analysis values: CHN measurement values (41.55%, 5.34%, 4.32%); theoretical values (41.66%, 5.17%, 4.11%)

Chemical Formula (8)

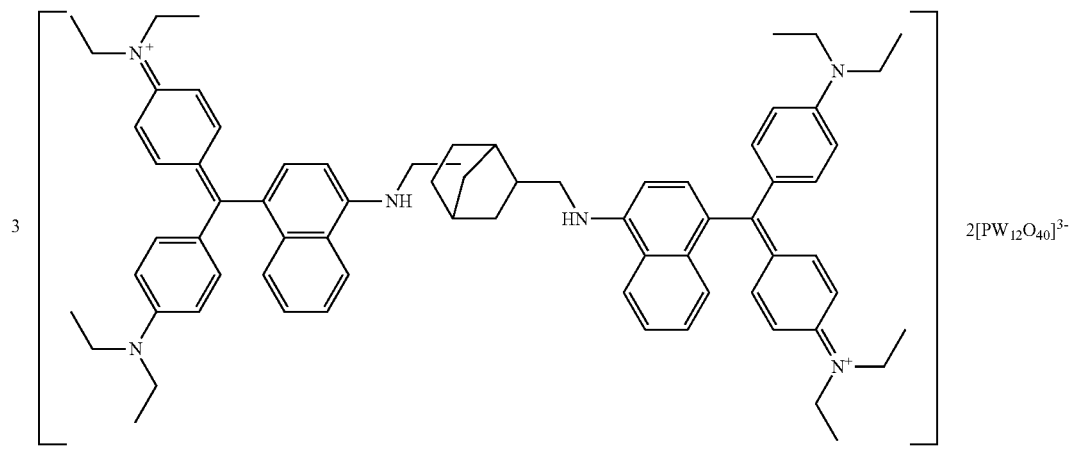

Comparative Synthesis Example 1: Synthesis of Aluminum Lake Color Material A First, 5.00 g of Acid Red 289 (manufactured by Tokyo Chemical Industry Co., Ltd., a rhodamine-based acid dye represented by the chemical formula (1)) was added to 166 ml of water and dissolved at 80° C. to prepare a dye solution. Then, 0.60 g of aluminum(III) chloride hexahydrate (manufactured by Kanto Chemical Co., Inc.) was added to 200 ml of water, and the mixture was stirred at normal temperature to prepare an aluminum chloride aqueous solution. The aluminum chloride aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 3.15 g of an aluminum lake color material A.

Comparative Synthesis Example 2: Synthesis of Aluminum Lake Color Material B First, 5.00 g of Acid Red 52 (manufactured by Tokyo Chemical Industry Co., Ltd., a rhodamine-based acid dye represented by the chemical formula (2)) was added to 166 ml of water and dissolved at normal temperature to prepare a dye solution. Then, 0.90 g of aluminum(III) chloride hexahydrate (manufactured by Kanto Chemical Co., Inc.) was added to 200 ml of water, and the mixture was stirred at normal temperature to prepare an aluminum chloride aqueous solution. The aluminum chloride aqueous solution thus prepared was added to the dye solution in a dropwise manner for 15 minutes, and the mixture was stirred at normal temperature for 1 hour. A precipitate thus produced was obtained by filtration and washed with water. A cake thus obtained was dried, thereby obtaining 0.75 g of an aluminum lake color material B.

Comparative Synthesis Example 3: Synthesis of Aluminum Lake Color Material C First, 5.00 g of Direct blue 86 (product name, manufactured by Tokyo Chemical Industry Co., Ltd., a phthalocyanine-based acid dye represented by the chemical formula (3)) was added to 166 ml of water and dissolved at 80° C. to prepare a dye solution. Then, 1.86 g of aluminum(III) chloride hexahydrate (manufactured by Kanto Chemical Co., Inc.) was added to 200 ml of water, and the mixture was stirred at normal temperature to prepare an aluminum chloride aqueous solution. The aluminum chloride aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 2.98 g of an aluminum lake color material C.

Comparative Synthesis Example 4: Synthesis of Aluminum Lake Color Material D First, 5.00 g of Acid violet 17 (manufactured by Sigma-Aldrich, a triarylmethane-based acid dye represented by the chemical formula (4)) was added to 166 ml of water and dissolved at 80° C. to prepare a dye solution. Then, 0.79 g of aluminum(III) chloride hexahydrate (manufactured by Kanto Chemical Co., Inc.) was added to 200 ml of water, and the mixture was stirred at normal temperature to prepare an aluminum chloride aqueous solution. The aluminum chloride aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 0.88 g of an aluminum lake color material D.

Comparative Synthesis Example 5: Synthesis of Aluminum Lake Color Material E First, 5.00 g of Acid blue 90 (manufactured by Tokyo Chemical Industry Co., Ltd., a triarylmethane-based acid dye represented by the chemical formula (5)) was added to 166 ml of water and dissolved at 80° C. to prepare a dye solution. Then, 0.47 g of aluminum(III) chloride hexahydrate (manufactured by Kanto Chemical Co., Inc.) was added to 200 ml of water, and the mixture was stirred at normal temperature to prepare an aluminum chloride aqueous solution. The aluminum chloride aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 3.35 g of an aluminum lake color material E.

Comparative Synthesis Example 6: Synthesis of Aluminum Lake Color Material F

First, 5.00 g of Acid red 183 (manufactured by Sigma-Aldrich, an azo-based acid dye represented by the chemical formula (6)) was added to 166 ml of water and dissolved at 80° C. to prepare a dye solution. Then, 1.51 g of aluminum (III) chloride hexahydrate (manufactured by Kanto Chemical Co., Inc.) was added to 200 ml of water, and the mixture was stirred at normal temperature to prepare an aluminum chloride aqueous solution. The aluminum chloride aqueous solution thus prepared was added to the dye solution in a dropwise manner for 15 minutes, and the mixture was stirred at 80° C. for 1 hour. A precipitate thus produced was obtained by filtration and washed with water. A cake thus obtained was dried, thereby obtaining 0.80 g of an aluminum lake color material F.

Comparative Synthesis Example 7: Synthesis of Phosphotungstic Acid Lake Color Material A First, 5.00 g of Rhodamine 6G (product name, manufactured by Tokyo Chemical Industry Co., Ltd., a rhodamine-based basic dye represented by the following chemical formula (9)) was added to 500 ml of water and dissolved at 90° C. to prepare a dye solution. Then, 11.90 g of phosphotungstic acid n-hydrate $H_3[PW_{12}O_{40}] \cdot nH_2O$ (manufactured by Nippon Inorganic Colour & Chemical Co., Ltd., n=30) was added to 200 ml of water, and the mixture was stirred at 90° C. to prepare a phosphotungstic acid aqueous solution. The phosphotungstic acid aqueous solution was added to the dye solution in a dropwise manner at 90° C. for 15 minutes, and the mixture was stirred at 90° C. for 1 hour. A precipitate thus produced was obtained by filtration and washed with water. A cake thus obtained was dried, thereby obtaining 13.45 g of a phosphotungstic acid lake color material A.

Chemical Formula (9)

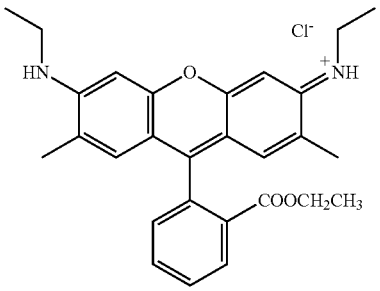

Comparative Synthesis Example 8: Synthesis of Quaternary Ammonium Salt-Forming Color Material A First, 5.00 g of Acid Red 289 (manufactured by Tokyo Chemical Industry Co., Ltd., a rhodamine-based acid dye represented by the chemical formula (1)) was added to 500 ml of water and dissolved at 80° C. to prepare a dye solution. Then, 4.99 g of Arquad 2HP Flake (product name, manufactured by LION AKZO Co., Ltd., dimethyl distearyl ammonium chloride, effective solid content 95.5%) was added to 85 g of isopropyl alcohol and dissolved to prepare a dimethyl distearyl ammonium chloride solution. The dye solution was cooled to 5° C. in an ice bath. The dimethyl distearyl ammonium chloride solution thus prepared was added to the dye solution in a dropwise manner at 5° C. for 25 minutes, and the mixture was stirred at 5° C. for 1 hour. A precipitate thus produced was obtained by filtration and washed with water. A cake thus obtained was dried, thereby obtaining 9.07 g of a quaternary ammonium salt-forming color material A.

Synthesis Example 10: Synthesis of Binder Resin A

First, 130 parts by mass of diethylene glycol ethyl methyl ether (EMDG), which is a solvent, was put in a reactor equipped with a cooling tube, an addition funnel, a nitrogen inlet, a mechanical stirrer and a digital thermometer. After the temperature of the solvent was increased to 90° C. under a nitrogen atmosphere, a mixture of 32 parts by mass of methyl methacrylate, 22 parts by mass of cyclohexyl methacrylate, 24 parts by mass of methacrylic acid, 2.0 parts by mass of AIBN, which is an initiator, and 4.5 parts by mass of n-dodecyl mercaptan, which is a chain transfer agent, was continuously added to the solvent in a dropwise manner for 1.5 hours.

Then, with maintaining the synthesis temperature, the reaction was continued. Two hours after the completion of the addition of the mixture in a dropwise manner, 0.05 part by mass of p-methoxyphenol, which is a polymerization inhibitor, was added thereto.

Next, with injecting air into the mixture, 22 parts by mass of glycidyl methacrylate was added to the mixture. After the temperature of the mixture was increased to 110° C., 0.2 part by mass of triethylamine was added thereto, and an addition reaction was caused at 110° C. for 15 hours in the mixture, thereby obtaining a binder resin A (solid content 44% by mass).

The binder resin A thus obtained had a mass average molecular weight (Mw) of 8500, a number average molecular weight (Mn) of 4200, a molecular weight distribution (Mw/Mn) of 2.02, and an acid value of 85 mgKOH/g.

Preparation Example 1: Preparation of Salt-Type Block Polymer Dispersant A Solution In a reactor, 60.74 parts by mass of PGMEA and 35.64 parts by mass (effective solid content 21.38 parts by mass) of a block copolymer containing tertiary amino groups (product name: BYK-LPN 6919; manufactured by: BYK-Chemie GmbH) (amine value 120 mgKOH/g, solid content 60% by mass) were dissolved. Then, 3.62 parts by mass (0.5 molar equivalent with respect to the tertiary amino groups of the block copolymer) of phenylphosphonic acid ("PPA" manufactured by Nissan Chemical Industries, Ltd.) was added to the mixture. The mixture was stirred at 40° C. for 30 minutes, thereby preparing a salt-type block polymer dispersant A solution (solid content 25% by mass).

Preparation Example 2: Preparation of Binder Composition A

A binder composition A (solid content 40% by mass) was prepared by mixing the following: 39.64 parts by mass of PGMEA, 36.36 parts by mass of the binder resin A of Synthesis Example 10 (solid content 44% by mass), 16.00 parts by mass of a pentafunctional and hexafunctional acrylate monomer (product name: ARONIX M403, manufactured by: TOAGOSEI Co., Ltd.), 6.00 parts by mass of 2-methyl-1[4-(methylthio)phenyl]-2-morpholinopropane-1-one (product name: Irgacure 907, manufactured by: BASF) and 2.00 parts by mass of 2,4-diethylthioxanthone (product name: KAYACURE DETX-S, manufactured by: Nippon Kayaku Co., Ltd.)

Preparation Example 3: Preparation of Binder Composition B

A binder composition B (solid content 40% by mass) was prepared by mixing the following: 39.64 parts by mass of cyclohexanone, 36.36 parts by mass of the binder resin A of Synthesis Example 10 (solid content 44% by mass), 16.00 parts by mass of a pentafunctional and hexafunctional acrylate monomer (product name: ARONIX M403, manufactured by: TOAGOSEI Co., Ltd.), 6.00 parts by mass of 2-methyl-1[4-(methylthio)phenyl]-2-morpholinopropane-1-one (product name: Irgacure 907, manufactured by: BASF) and 2.00 parts by mass of 2,4-diethylthioxanthone (product name: KAYACURE DETX-S, manufactured by: Nippon Kayaku Co., Ltd.)

Example 1

(1) Preparation of Color Material Dispersion Liquid A1

First, 5.00 parts by mass of the zirconium lake color material A1 of Synthesis Example 1, 36.00 parts by mass (effective solid content 9.00 parts by mass) of the salt-type block polymer dispersant A solution prepared in Preparation Example 1, and 59.00 parts by mass of PGMEA were mixed. Using a paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a color material dispersion liquid A1.

(2) Preparation of Color Resin Composition A1

First, 70.98 parts by mass of the color material dispersion liquid A obtained in the above (1), 18.16 parts by mass of the binder composition A obtained in Preparation Example 2, 10.42 parts by mass of PGMEA, 0.04 part by mass of surfactant R08MH (product name, manufactured by DIC) and 0.40 part by mass of silane coupling agent KBM503 (product name, manufactured by Shin-Etsu Silicones) were mixed. The mixture thus obtained was subjected to pressure filtration, thereby obtaining a color resin composition A1.

Example 2

(1) Preparation of Color Material Dispersion Liquid A2

A color material dispersion liquid A2 was prepared in the same manner as the above (1) in Example 1, except that the zirconium lake color material A1 was changed to the zirconium lake color material A2 of Synthesis Example 2, and the main dispersion time was changed to 12 hours.

(2) Preparation of Color Resin Composition A2

A color resin composition A2 was obtained in the same manner as the above (2) in Example 1, except that the color material dispersion liquid A2 obtained above was used in place of the color material dispersion liquid A1.

Example 3

(1) Preparation of Color Material Dispersion Liquid A3

A color material dispersion liquid A3 was prepared in the same manner as the above (1) in Example 1, except that the zirconium lake color material A1 was changed to the zirconium lake color material A3 of Synthesis Example 3.

(2) Preparation of Color Resin Composition A3

A color resin composition A3 was obtained in the same manner as the above (2) in Example 1, except that the color material dispersion liquid A3 obtained above was used in place of the color material dispersion liquid A1.

Comparative Examples 1 to 4

(1-1) Preparation of Comparative Color Material Dispersion Liquids A1, A3 and A4

Comparative color material dispersion liquids A1, A3 and A4 were prepared in the same manner as the above (1) in Example 1, except that the zirconium lake color material A1 was changed to the aluminum lake color material A of Comparative Synthesis Example 1, the phosphotungstic acid lake color material A of Comparative Synthesis Example 7, and the quaternary ammonium salt-forming color material of Comparative Synthesis Example 8, respectively.

(1-2) Preparation of Comparative Color Material Dispersion Liquid A2

A comparative color material dispersion liquid A2 was prepared in the same manner as the above (1) in Example 1, except that the zirconium lake color material A1 was changed to the aluminum lake color material A of Comparative Synthesis Example 1, and the main dispersion time was changed to 12 hours.

(2) Preparation of Comparative Color Resin Compositions A1 to A4

Comparative color resin compositions A1 to A4 were obtained in the same manner as the above (2) in Example 1, except that the above-obtained comparative color material dispersion liquids A1 to A4 were used in place of the color material dispersion liquid A1, respectively.

Comparative Example 5

(1) Preparation of Comparative Color Material Solution A5

A comparative color material solution A5 in which the quaternary ammonium salt-forming color material A was dissolved, was prepared by mixing the following: 5.00 parts by mass of the quaternary ammonium salt-forming color material A of Comparative Synthesis Example 8, 20.45 parts by mass of the binder resin A of Synthesis Example 10 (effective solid content 9.00 parts by mass) and 74.55 parts by mass of cyclohexanone.

(3) Preparation of Comparative Color Resin Composition A5

First, 70.98 parts by mass of the comparative color material solution A5 obtained in the above (1), 18.16 parts by mass of the binder composition B obtained in Preparation Example 3, 10.42 parts by mass of cyclohexanone, 0.04 part by mass of surfactant R08MH (product name, manufactured by DIC) and 0.40 part by mass of silane coupling agent KBM503 (product name, manufactured by Shin-Etsu Silicones) were mixed. The mixture thus obtained was subjected to pressure filtration, thereby obtaining a comparative color resin composition A5.

Examples 4 to 8

(1) Preparation of Color Material Dispersion Liquids B to F

Color material dispersion liquids B to F were prepared in the same manner as the above (1) in Example 1, except that the zirconium lake color material A1 was changed to the zirconium lake color materials B to F of Synthesis Examples 4 to 8, respectively.

(2) Preparation of Color Resin Compositions B to F

Color resin compositions B to F were obtained in the same manner as the above (2) in Example 1, except that the above-obtained color material dispersion liquids B to F were used in place of the color material dispersion liquid A1, respectively.

Comparative Examples 6 to 10

(1) Preparation of Comparative Color Material Dispersion Liquids B to F

Comparative color material dispersion liquids B to F were prepared in the same manner as the above (1) in Example 1, except that the zirconium lake color material A1 was changed to the aluminum lake color materials B to F of Comparative Synthesis Examples 2 to 6, respectively.

(2) Preparation of Comparative Color Resin Compositions B to F

Comparative color resin compositions B to F were obtained in the same manner as the above (2) in Example 1, except that the above-obtained comparative color material dispersion liquids B to F were used in place of the color material dispersion liquid A1, respectively.

Example 9

(1) Preparation of Blue Color Material Dispersion Liquid A

First, 12.03 parts by mass of the blue lake color material α of Synthesis Example 9 and 0.97 part by mass of the zirconium lake color material A1 of Synthesis Example 1, which are both color material components, 18.20 parts by mass of the salt-type block polymer dispersant A solution prepared in Preparation Example 1 (effective solid content 4.55 parts by mass), 13.30 parts by mass of the binder resin A of Synthesis Example 10 (effective solid content 5.85 parts by mass) and 55.50 parts by mass of PGMEA were mixed. Using the paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a blue color material dispersion liquid A.

(2) Preparation of Blue Color Resin Composition A

First, 27.30 parts by mass of the blue color material dispersion liquid A obtained as the above (1), 27.03 parts by mass of the binder composition A obtained in Preparation Example 2, 55.50 parts by mass of PGMEA, 0.04 part by mass of surfactant R08MH (product name, manufactured by DIC) and 0.40 part by mass of silane coupling agent KBM503 (product name, manufactured by Shin-Etsu Silicones) were mixed. The mixture thus obtained was subjected to pressure filtration, thereby obtaining a blue color resin composition A.

Example 10

(1) Preparation of Blue Color Material Dispersion Liquid B

A blue color material dispersion liquid B was prepared in the same manner in the above (1) in Example 9, except that the color material components were changed to 11.31 parts by mass of the blue lake color material α of Synthesis Example 9 and 1.69 parts by mass of the zirconium lake color material B of Synthesis Example 4.

(2) Preparation of Blue Color Resin Composition B

A blue color resin composition B was obtained in the same manner as the above (2) in Example 9, except that the above-obtained blue color material dispersion liquid B was used in place of the blue color material dispersion liquid A.

Comparative Examples 11 to 15

(1) Preparation of Comparative Blue Color Material Dispersion Liquids A to E

Comparative blue color material dispersion liquids A to E were prepared in the same manner as the above (1) in Example 9, except that the color material components were changed to the following: in Comparative Example 11, 12.16 parts by mass of the blue lake color material α of Synthesis Example 9 and 0.85 part by mass of the aluminum lake color material A of Comparative Synthesis Example 1; in Comparative Example 12, 11.96 parts by mass of the blue lake color material α of Synthesis Example 9 and 1.04 parts by mass of the phosphotungstic acid lake color material A of Comparative Synthesis Example 7; in Comparative Example 13, 11.70 parts by mass of the blue lake color material α of Synthesis Example 9 and 1.30 parts by mass of a dioxazine-based pigment (Pigment Violet 23 or PV23); in Comparative Example 14, 10.40 parts by mass of a phthalocyanine-based pigment (Pigment Blue 15:6 or PB15:6) and 2.60 parts by mass of the phosphotungstic acid lake color material A of Comparative Synthesis Example 7; and in Comparative Example 15, 9.75 parts by mass of the phthalocyanine-based pigment (Pigment Blue 15:6 or PB15:6) and 3.25 parts by mass of the dioxazine-based pigment (PV23).

(2) Preparation of Comparative Blue Color Resin Compositions a to E

Comparative blue color resin compositions A to E were obtained in the same manner as the above (2) in Example 9, except that the above-obtained comparative blue color material dispersion liquids A to E were used in place of the blue color material dispersion liquid A, respectively.

(Preparation of Blue Color Material Dispersion Liquid α for Toning)

First, 13.00 parts by mass of the blue lake color material α of Synthesis Example 9, 20.80 parts by mass of the salt-type block polymer dispersant A solution prepared in Preparation Example 1 (effective solid content 5.20 parts by mass), 11.82 parts by mass of the binder resin A of Synthesis Example 10 (effective solid content 5.20 parts by mass) and 54.38 parts by mass of PGMEA were mixed. Using the paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a blue color material dispersion liquid α for toning.

Example 11: Preparation of Blue Color Resin Composition

First, 25.14 parts by mass of the above-obtained blue color material dispersion liquid α for toning, 5.30 parts by mass of the color material dispersion liquid A1 obtained in Example 1, 26.24 parts by mass of the binder composition A obtained in Preparation Example 2, 42.88 parts by mass of PGMEA, 0.04 part by mass of surfactant R08MH (product name, manufactured by DIC) and 0.40 part by mass of silane coupling agent KBM503 (product name, manufactured by Shin-Etsu Silicones) were mixed. The mixture thus obtained was subjected to pressure filtration, thereby obtaining a blue color resin composition.

Example 12: Preparation of Blue Color Resin Composition

A blue color resin composition was obtained in the same manner as Example 11, except that the color material dispersion liquid A2 obtained in Example 2 was used in place of the color material dispersion liquid A1.

Comparative Example 16: Preparation of Comparative Blue Color Resin Composition

First, 25.42 parts by mass of the above-obtained blue color material dispersion liquid α for toning, 4.59 parts by mass of the comparative color material dispersion liquid A1 obtained in Comparative Example 1, 26.32 parts by mass of the binder composition A obtained in Preparation Example 2, 43.23 parts by mass of PGMEA, 0.04 part by mass of surfactant R08MH (product name, manufactured by DIC) and 0.40 part by mass of silane coupling agent KBM503 (product name, manufactured by Shin-Etsu Silicones) were mixed. The mixture thus obtained was subjected to pressure filtration, thereby obtaining a comparative blue color resin composition.

Comparative Example 17: Preparation of Comparative Blue Color Resin Composition

A comparative blue color resin composition was obtained in the same manner as Comparative Example 16, except that the comparative color material dispersion liquid A2 obtained in Comparative Example 2 was used in place of the comparative color material dispersion liquid A1.
(Evaluation)
<Dispersion Performance Evaluation>
To evaluate the dispersion performance of the color material dispersion liquids used in Examples and Comparative Examples, the average particle diameter of the color material particles in the color material dispersion liquids were measured. To measure the average particle diameter, "Nanotrac Particle Size Analyzer UPA-EX150" (product name, manufactured by Nikkiso Co., Ltd.) was used. The average particle diameter used herein means both the average dispersed particle diameter and the volume average particle diameter. The results are shown in Tables 1 to 3.

<Optical Performance Evaluation>
Each of the blue color resin compositions obtained in Examples and Comparative Examples was applied onto a glass substrate having a thickness of 0.7 mm ("OA-10G" manufactured by Nippon Electric Glass Co., Ltd.) using a spin coater, heat-dried on the hot plate at 80° C. for 3 minutes, and then irradiated with ultraviolet light at 40 mJ/cm$^2$ using an ultrahigh-pressure mercury lamp, thereby obtaining a color coating film. The substrate on which the color coating film was formed, was subjected to post baking in a clean oven at 150° C., 200° C. or 230° C. for 25 minutes, and the contrast value was measured using contrast measuring device "CT-1B" manufactured by Tsubosaka Electric Co., Ltd.

For the color resin compositions of Examples 1 to 8 and Comparative Examples 1 to 10, the thickness of the color coating film was 3.0 μm. For the blue color resin compositions of Examples 9 to 12 and Comparative Examples to 17, the thickness of the color coating film was a thickness that provides a chromaticity of y=0.082. The chromaticity and luminance of the color coating film were measured using microscopic spectrophotometer "OSP-SP200" manufactured by Olympus Corporation.

The results are shown in Tables 1 to 4.
<Sublimability Evaluation>
In the same manner as above, each of the color resin compositions obtained in Examples 1 to 3 and Comparative Examples 1 to 5 and the blue color resin compositions obtained in Examples 9 to 12 and Comparative Examples 11 to 17, was applied onto a glass substrate having a thickness of 0.7 mm ("OA-10G" manufactured by Nippon Electric Glass Co., Ltd.) using the spin coater and heat-dried on the hot plate at 80° C. for 3 minutes. A color layer thus obtained was irradiated with ultraviolet light at 40 mJ/cm$^2$ using the ultrahigh-pressure mercury lamp, through a photomask with an 80 μm line-and-space stripe pattern. Then, the glass substrate on which the color layer was formed, was subjected to shower development for 60 seconds, using a 0.05% by mass potassium hydroxide aqueous solution as an alkaline developer. Then, the glass substrate was washed with ultrapure water for 60 seconds.

A glass substrate was placed 0.7 mm above the glass substrate on which a color pattern thus obtained was formed, and the glass substrate on which the color pattern was formed was heated on the hot plate at 230° C. for 30 minutes. To evaluate sublimability, the upper glass substrate was visually observed to see if a sublimate appeared thereon.
A: No sublimate appeared
B: A sublimate appeared
The results are shown in Tables 1, 3 and 4.

TABLE 1

| | Color material dispersion liquid | Color material | Anion | Cation | Solvent | Dispersion time (h) | Particle diameter (nm) | Post baking temperature | Contrast | Sublimability |
|---|---|---|---|---|---|---|---|---|---|---|
| Example 1 | Color material dispersion liquid A1 | Zirconium lake color material A1 | Acid Red 289 | Zircosol ZC-20 (ZrOCl2) | PGMEA | 6 | 88 | 230° C. | 2727 | A |
| Example 2 | Color material dispersion liquid A2 | Zirconium lake color material A2 | Acid Red 289 | Zircosol ZC-2 (ZrO(OH)Cl) | PGMEA | 12 | 115 | 230° C. | 2618 | A |

TABLE 1-continued

| | Color material dispersion liquid | Color material | Color material Anion | Color material Cation | Solvent | Dispersion time (h) | Particle diameter (nm) | Post baking temperature | Contrast | Sub-limability |
|---|---|---|---|---|---|---|---|---|---|---|
| Example 3 | Color material dispersion liquid A3 | Zirconium lake color material A3 | Acid Red 289 | Zirconium oxychloride octahydrate | PGMEA | 6 | 94 | 230° C. | 2749 | A |
| Comparative Example 1 | Comparative color material dispersion liquid A1 | Aluminum lake color material A | Acid Red 289 | Aluminum chloride (AlCl$_3$) | PGMEA | 6 | 509 | 230° C. | 380 | A |
| Comparative Example 2 | Comparative color material dispersion liquid A2 | Aluminum lake color material A | Acid Red 289 | Aluminum chloride (AlCl$_3$) | PGMEA | 12 | 585 | 230° C. | 1561 | A |
| Comparative Example 3 | Comparative color material dispersion liquid A3 | Phosphotungstic acid lake color material A | Phosphotungstic acid | Rhodamine 6G | PGMEA | 6 | 141 | 230° C. | 1290 | B (Red) |
| Comparative Example 4 | Comparative color material dispersion liquid A4 | Quaternary ammonium salt-forming color material A | Acid Red 289 | Arquad 2HP | PGMEA | 6 | 2974 | 230° C. | 853 | B (White) |
| Comparative Example 5 | Comparative color material solution A5 | Quaternary ammonium salt-forming color material A | Acid Red 289 | Arquad 2HP | Cyclohexanone | 6 | Dissolved | 230° C. | 630 | B (White) |

TABLE 2

| | Color material dispersion liquid | Color material | Color material Anion | Color material Cation | Particle diameter (nm) | Post baking temperature | Contrast |
|---|---|---|---|---|---|---|---|
| Example 4 | Color material dispersion liquid B | Zirconium lake color material B | Acid Red 52 | Zircosol ZC-20 (ZrOCl2) | 98 | 230° C. | 2732 |
| Comparative Example 6 | Comparative color material dispersion liquid B | Aluminum lake color material B | Acid Red 52 | Aluminum chloride (AlCl$_3$) | 185 | 230° C. | 2052 |
| Example 5 | Color material dispersion liquid C | Zirconium lake color material C | Direct Blue 86 | Zircosol ZC-20 (ZrOCl2) | 471 | 200° C. | 4459 |
| Comparative Example 7 | Comparative color material dispersion liquid C | Aluminum lake color material C | Direct Blue 86 | Aluminum chloride (AlCl$_3$) | 755 | 200° C. | 856 |
| Example 6 | Color material dispersion liquid D | Zirconium lake color material D | Acid Violet 17 | Zircosol ZC-20 (ZrOCl2) | 34 | 150° C. | 7101 |
| Comparative Example 8 | Comparative color material dispersion liquid D | Aluminum lake color material D | Acid Violet 17 | Aluminum chloride (AlCl$_3$) | 905 | 150° C. | 572 |
| Example 7 | Color material dispersion liquid E | Zirconium lake color material E | Acid Blue 90 | Zircosol ZC-20 (ZrOCl2) | 79 | 150° C. | 7223 |
| Comparative Example 9 | Comparative color material dispersion liquid E | Aluminum lake color material E | Acid Blue 90 | Aluminum chloride (AlCl$_3$) | 503 | 150° C. | 2373 |
| Example 8 | Color material dispersion liquid F | Zirconium lake color material F | Acid Red 183 | Zircosol ZC-20 (ZrOCl2) | 117 | 200° C. | 8213 |

TABLE 2-continued

| | Color material dispersion liquid | Color material | | | Particle diameter (nm) | Post baking temperature | Contrast |
|---|---|---|---|---|---|---|---|
| | | Color material | Anion | Cation | | | |
| Comparative Example 10 | Comparative color material dispersion liquid F | Aluminum lake color material F | Acid Red 183 | Aluminum chloride (AlCl$_3$) | 288 | 200° C. | 1033 |

TABLE 3

| | Color material dispersion liquid | Blue color material | Violet color material | | |
|---|---|---|---|---|---|
| | | | Color material | Anion | Cation |
| Example 9 | Blue color material dispersion liquid A | Blue lake color material α | Zirconium lake color material A1 | Acid Red 289 | Zircosol ZC-20 (ZrOCl2) |
| Example 10 | Blue color material dispersion liquid B | Blue lake color material α | Zirconium lake color material B | Acid Red 52 | Zircosol ZC-20 (ZrOCl2) |
| Comparative Example 11 | Comparative blue color material dispersion liquid A | Blue lake color material α | Aluminum lake color material A | Acid Red 289 | Aluminum chloride (AlCl$_3$) |
| Comparative Example 12 | Comparative blue color material dispersion liquid B | Blue lake color material α | Phosphotungstic acid lake color material A | Phosphotungstic acid | Basic Red 1 (Rhodamine 6G) |
| Comparative Example 13 | Comparative blue color material dispersion liquid C | Blue lake color material α | | PV23 | |
| Comparative Example 14 | Comparative blue color material dispersion liquid D | PB15:6 | Phosphotungstic acid lake color material A | Phosphotungstic acid | Basic Red 1 (Rhodamine 6G) |
| Comparative Example 15 | Comparative blue color material dispersion liquid E | PB15:6 | | PV23 | |

| | B/V Ratio | Particle diameter (nm) | After post baking (230° C., 25 min) | | | | Sublimability |
|---|---|---|---|---|---|---|---|
| | | | x | y | Y | Contrast | |
| Example 9 | 92.5/7.5 | 107 | 0.144 | 0.082 | 10.32 | 4545 | A |
| Example 10 | 87/13 | 130 | 0.145 | 0.082 | 10.36 | 4366 | A |
| Comparative Example 11 | 93.5/6.5 | 110 | 0.146 | 0.082 | 10.26 | 3664 | A |
| Comparative Example 12 | 92/8 | 106 | 0.146 | 0.082 | 10.23 | 4705 | B (Red) |
| Comparative Example 13 | 90/10 | 90 | 0.146 | 0.082 | 9.79 | 4301 | A |
| Comparative Example 14 | 80/20 | 133 | 0.146 | 0.082 | 9.03 | 2599 | B (Red) |
| Comparative Example 15 | 75/25 | 45 | 0.147 | 0.082 | 8.86 | 3731 | A |

B/V ratio = (Solid content (parts by mass) of blue color material)/(Solid content (parts by mass) of violet color material)

TABLE 4

| | Blue Color material dispersion liquid | Blue color material | Violet Color material dispersion liquid | Anion | Cation | B/V Ratio | Dispersion time (h) | Optical performance x | y | Y | Contrast | Sub-limability |
|---|---|---|---|---|---|---|---|---|---|---|---|---|
| Example 11 | Blue color material dispersion liquid α for toning | Blue lake color material α | Color material dispersion liquid A1 | Acid Red 289 | Zircosol ZC-20 (ZrOCl2) | 92.5/7.5 | 6 | 0.144 | 0.082 | 10.35 | 4456 | A |
| Comparative Example 16 | Blue color material dispersion liquid α for toning | Blue lake color material α | Comparative color material dispersion liquid A1 | Acid Red 289 | Aluminum chloride (AlCl3) | 93.5/6.5 | 6 | 0.147 | 0.082 | 10.24 | 3765 | A |
| Example 12 | Blue color material dispersion liquid α for toning | Blue lake color material α | Color material dispersion liquid A2 | Acid Red 289 | Zircosol ZC-2 (ZrO(OH)Cl) | 92.5/7.5 | 12 | 0.144 | 0.082 | 10.34 | 4383 | A |
| Comparative Example 17 | Blue color material dispersion liquid α for toning | Blue lake color material α | Comparative color material dispersion liquid A2 | Acid Red 289 | Aluminum chloride (AlCl3) | 93.5/6.5 | 12 | 0.148 | 0.082 | 10.29 | 3759 | A |

B/V ratio = Solid content (parts by mass) of blue color material/(Solid content (parts by mass) of violet color material)

CONCLUSION

The following are clear from the above results: the color material dispersion liquids of Examples 1 to 8, which contain the zirconium lake color materials of the acid dyes, are smaller in dispersed particle diameter and better in dispersibility than the color material dispersion liquids of Comparative Examples 1, 2 and 6 to 10, which contain the aluminum lake color materials of the acid dyes. The color resin compositions obtained by the use of the color material dispersion liquids of Examples 1 to 8, are high in the contrast of the color coating film. In Examples 1 to 3, no sublimate appeared during the post baking. Meanwhile, a red sublimate was confirmed in the sublimability evaluation of the color coating film of the color resin composition obtained by the use of Comparative Example 3 which contains the phosphotungstic acid lake color material of the rhodamine-based basic dye being the basic dye. A white sublimate was confirmed in the sublimability evaluation of the color coating films of the color resin compositions obtained by the use of Comparative Examples 4 and 5 which contain the quaternary ammonium salt-forming color material of the rhodamine-based acid dye.

It is clear that Examples 9 and 10 which contain the triarylmethane-based blue lake color material α and the zirconium lake color materials of the acid dyes, are small in dispersed particle diameter and excellent in dispersibility. The blue color resin compositions obtained by the use of the color material dispersion liquids of Examples 9 and 10, are high in the contrast of the color coating film. To compare the luminances of the coating films of the blue color resin compositions obtained in Examples 9 and 10 and Comparative Examples 11 to 15, the blue color resin compositions were produced by combining the color materials with the blue color materials, and the y values of the coating films were set to the same value. As a result, it is shown that Examples 9 and 10 are better in luminance than Comparative Example 11 which contains the aluminum lake color material of the rhodamine-based acid dye and Comparative Example 12 which contains the phosphotungstic acid lake color material of the rhodamine-based basic dye. Also, Examples 9 and 10 are remarkably better in luminance than Comparative Examples 13 to 15 which contain the pigments. No sublimate was found in the sublimability evaluation of Examples 9 and 10. Meanwhile, a red sublimate was confirmed in the sublimability evaluation of Comparative Examples 12 and 14 which contain the phosphotungstic acid lake color material of the rhodamine-based basic dye.

The contrast of the color coating film of the blue color resin composition is higher in Examples 11 and 12 obtained by mixing the blue color material dispersion liquid α for toning, the dispersion liquid containing the triarylmethane-based blue lake color material α, with the color material dispersion liquid containing the zirconium lake color material of the acid dye, than in Comparative Examples 16 and 17 obtained by mixing the blue color material dispersion liquid α for toning with the color material dispersion liquid containing the aluminum lake color material of the acid dye. To compare the luminances of the coating films of the color resin compositions obtained in Examples 11 and 12 and Comparative Examples 16 and 17, the color resin compositions were produced by combining the color materials with the blue color material, and the y values of the coating films were set to the same value. As a result, it is shown that Examples 11 and 12 are better in luminance than Comparative Examples 16 and 17.

REFERENCE SIGNS LIST

1. Transparent substrate
2. Light shielding part
3. Color layer
10. Color filter
20. Counter substrate
30. Liquid crystal layer
40. Liquid crystal display device 50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Light-emitting body
100. Light-emitting display device

The invention claimed is:

1. A color material dispersion liquid for a color filter, comprising: (A) a color material, (B) a dispersant and (C) a solvent, wherein the color material (A) contains a zirconium lake color material of a rhodamine-based acid dye.

2. The color material dispersion liquid for a color filter according to claim 1, wherein a laking agent of the zirconium lake color material of the acid dye is a zirconium compound that can form a basic polynuclear condensed ion.

3. The color material dispersion liquid for a color filter according to claim 1, wherein the laking agent of the zirconium lake color material of the acid dye is at least one of dichlorooxozirconium, chlorohydroxyoxozirconium and hydrates thereof.

4. The color material dispersion liquid for a color filter according to claim 1, wherein the acid dye in the zirconium lake color material of the acid dye, is the rhodamine-based acid dye.

5. The color material dispersion liquid for a color filter according to claim 2, wherein the acid dye in the zirconium lake color material of the acid dye, is the rhodamine-based acid dye.

6. The color material dispersion liquid for a color filter according to claim 3, wherein the acid dye in the zirconium lake color material of the acid dye, is the rhodamine-based acid dye.

7. The color material dispersion liquid for a color filter according to claim 1, wherein the color material (A) further contains a color material represented by the following general formula (I):

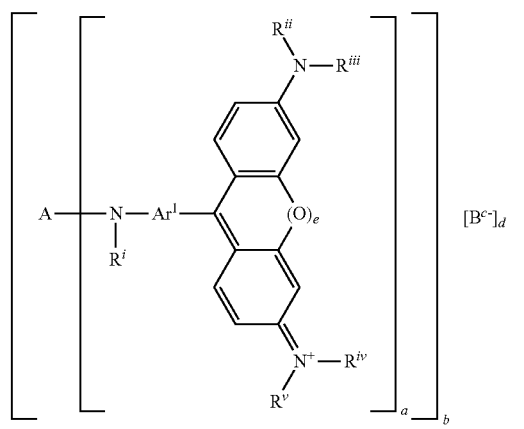

wherein "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

8. The color material dispersion liquid for a color filter according to claim 2, wherein the color material (A) further contains a color material represented by the following general formula (I):

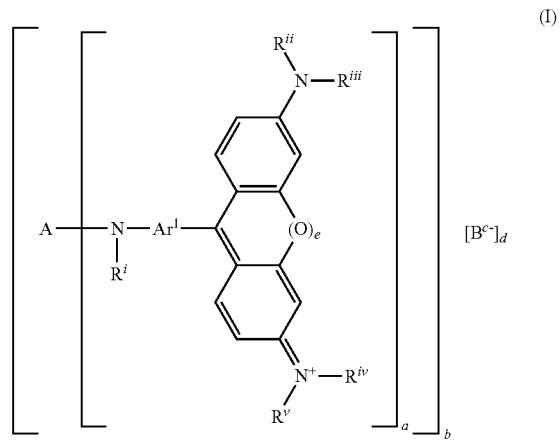

wherein "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

9. The color material dispersion liquid for a color filter according to claim 3, wherein the color material (A) further contains a color material represented by the following general formula (I):

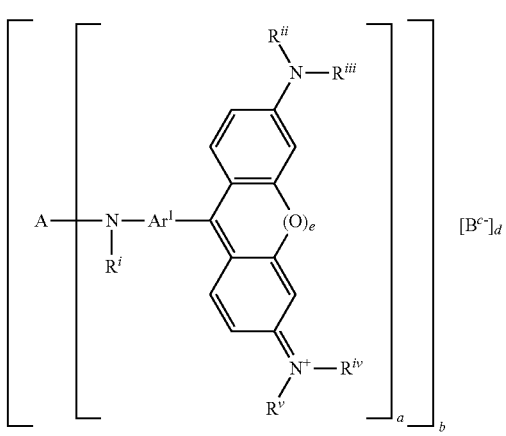

wherein "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

10. The color material dispersion liquid for a color filter according to claim 4, wherein the color material (A) further contains a color material represented by the following general formula (I):

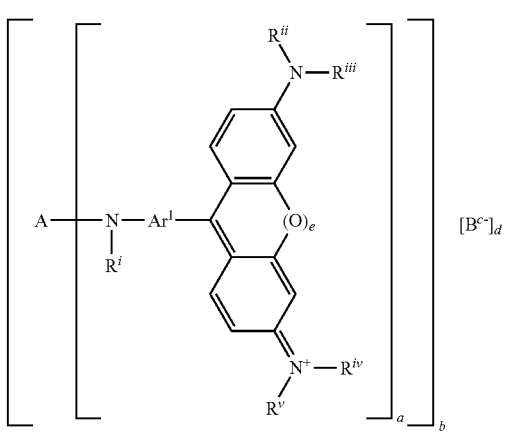

wherein "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

11. A color resin composition for a color filter, comprising the color material dispersion liquid defined by claim 1 and (D) a binder component.

12. A color material for a color filter, wherein the color material is a zirconium lake color material of a rhodamine-based acid dye.

13. The color material for a color filter according to claim 12, wherein a laking agent of the zirconium lake color material of the rhodamine-based acid dye is a zirconium compound that can form a basic polynuclear condensed ion.

14. The color material for a color filter according to claim 12, wherein the laking agent of the zirconium lake color material of the rhodamine-based acid dye is at least one of dichlorooxozirconium, chlorohydroxyoxozirconium and hydrates thereof.

15. A color filter comprising at least a transparent substrate and color layers disposed on the substrate, wherein at least one of the color layers contains a zirconium lake color material of a rhodamine-based acid dye.

16. A liquid crystal display device comprising the color filter defined by claim 15, a counter substrate, and a liquid crystal layer disposed between the color filter and the counter substrate.

17. A light-emitting display device comprising the color filter defined by claim 15 and a light-emitting body.

18. The color material dispersion liquid for a color filter according to claim 1, wherein, for the zirconium lake color material of the acid dye, the acid dye is a rhodamine-based acid dye represented by the following general formula (II):

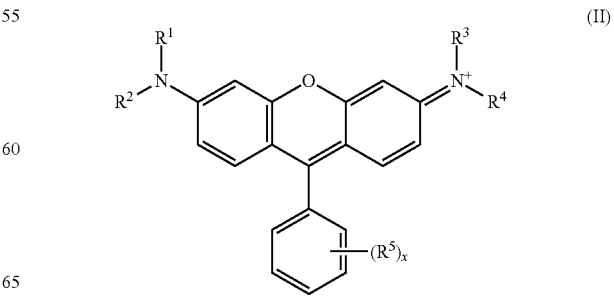

wherein each of R1, R2, R3 and R4 is independently a hydrogen atom, an alkyl group, an aryl group or a heteroaryl group; R1 and R2 can be bound to form a ring structure, and/or R3 and R4 can be bound to form ring structure; R1 and a carbon atom at the 5-position of the xanthene ring, R2 and a carbon atom at the 7-position of the xanthene ring, R3 and a carbon atom at the 4-position of the xanthene ring, or R4 and a carbon atom at the 2-position of the xanthene ring can be bound to form a ring structure; the hydrogen atom in the aryl or heteroaryl group can be substituted with an acidic group or a salt thereof, or with a halogen atom; R5 is an acidic group or a salt thereof; "x" is an integer of 0 to 5; and the general formula (II) has at least two acidic groups or salts thereof, and one of the at least two acidic groups or salts thereof forms an intramolecular salt.

19. The color material for a color filter according to claim 12, wherein the rhodamine-based acid dye is a rhodamine-based acid dye represented by the following general formula (II):

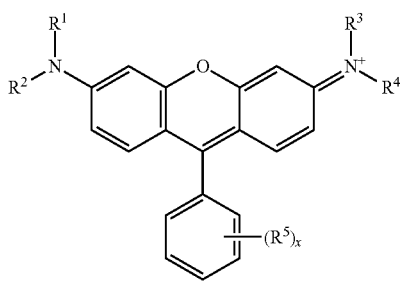

(II)

wherein each of R1, R2, R3 and R4 is independently a hydrogen atom, an alkyl group, an aryl group or a heteroaryl group; R1 and R2 can be bound to form a ring structure, and/or R3 and R4 can be bound to form ring structure; R1 and a carbon atom at the 5-position of the xanthene ring, R2 and a carbon atom at the 7-position of the xanthene ring, R3 and a carbon atom at the 4-position of the xanthene ring, or R4 and a carbon atom at the 2-position of the xanthene ring can be bound to form a ring structure; the hydrogen atom in the aryl or heteroaryl group can be substituted with an acidic group or a salt thereof, or with a halogen atom; R5 is an acidic group or a salt thereof; "x" is an integer of 0 to 5; and the general formula (II) has at least two acidic groups or salts thereof, and one of the at least two acidic groups or salts thereof forms an intramolecular salt.

20. The color filter according to claim 15, wherein, for the zirconium lake color material of the acid dye, the acid dye is a rhodamine-based acid dye represented by the following general formula (II):

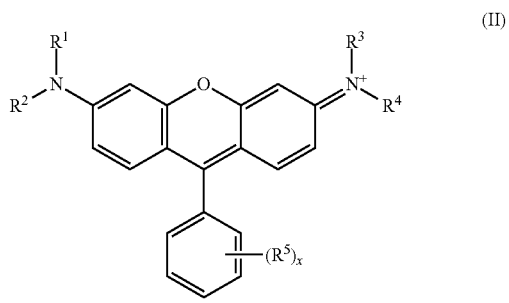

(II)

wherein each of R1, R2, R3 and R4 is independently a hydrogen atom, an alkyl group, an aryl group or a heteroaryl group; R1 and R2 can be bound to form a ring structure, and/or R3 and R4 can be bound to form ring structure; R1 and a carbon atom at the 5-position of the xanthene ring, R2 and a carbon atom at the 7-position of the xanthene ring, R3 and a carbon atom at the 4-position of the xanthene ring, or R4 and a carbon atom at the 2-position of the xanthene ring can be bound to form a ring structure; the hydrogen atom in the aryl or heteroaryl group can be substituted with an acidic group or a salt thereof, or with a halogen atom; R5 is an acidic group or a salt thereof; "x" is an integer of 0 to 5; and the general formula (II) has at least two acidic groups or salts thereof, and one of the at least two acidic groups or salts thereof forms an intramolecular salt.

* * * * *